US010249604B2

(12) United States Patent
Chu et al.

(10) Patent No.: US 10,249,604 B2
(45) Date of Patent: Apr. 2, 2019

(54) SEMICONDUCTOR DEVICE AND METHOD OF MANUFACTURING THE SAME

(71) Applicant: Samsung Electronics Co., Ltd., Suwon-si, Gyeonggi-do (KR)

(72) Inventors: Kunmo Chu, Seoul (KR); Changyoul Moon, Suwon-si (KR); Sunghee Lee, Suwon-si (KR); Junsik Hwang, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/656,298

(22) Filed: Mar. 12, 2015

(65) Prior Publication Data

US 2016/0049564 A1 Feb. 18, 2016

(30) Foreign Application Priority Data

Aug. 13, 2014 (KR) .................. 10-2014-0105430

(51) Int. Cl.
*H01L 23/48* (2006.01)
*H01L 25/00* (2006.01)
(Continued)

(52) U.S. Cl.
CPC .............. *H01L 25/50* (2013.01); *H01L 24/24* (2013.01); *H01L 24/29* (2013.01); *H01L 24/32* (2013.01);
(Continued)

(58) Field of Classification Search
CPC . H01L 2224/04026; H01L 2224/05666; H01L 2224/05671; H01L 2224/131;
(Continued)

(56) References Cited

U.S. PATENT DOCUMENTS 4,929,516 A 5/1990 Pryor et al.
5,234,153 A * 8/1993 Bacon .................. B23K 20/023
228/122.1
(Continued)

FOREIGN PATENT DOCUMENTS

CN 86101652 A 11/1986
CN 1335642 A 2/2002
(Continued)

OTHER PUBLICATIONS

Deng et al., "Young's modulus of (Cu, Ag)—Sn intermetallics measured by nanoindentation". Materials Science and Engineering A364 (2004) 240-243.*
(Continued)

*Primary Examiner* — Nitin Parekh
(74) *Attorney, Agent, or Firm* — Harness, Dickey & Pierce, P.L.C.

(57) ABSTRACT

A semiconductor device includes a base substrate and a semiconductor chip on the base substrate, the semiconductor chip including a first layer structure and a second layer structure opposite to the first layer structure, at least one of the first and second layer structures including a semiconductor device portion, and a bonding structure between the first layer structure and the second layer structure, the bonding structure including a silver-tin (Ag—Sn) compound and a nickel-tin (Ni—Sn) compound.

21 Claims, 20 Drawing Sheets

(51) Int. Cl.
*H01L 23/00* (2006.01)
*H01L 25/065* (2006.01)
*H01L 33/00* (2010.01)

(52) U.S. Cl.
CPC .............. *H01L 24/73* (2013.01); *H01L 24/83* (2013.01); *H01L 24/92* (2013.01); *H01L 25/0657* (2013.01); *H01L 33/0079* (2013.01); H01L 23/481 (2013.01); H01L 24/05 (2013.01); H01L 24/13 (2013.01); H01L 24/16 (2013.01); H01L 24/33 (2013.01); H01L 24/48 (2013.01); H01L 24/82 (2013.01); H01L 24/94 (2013.01); H01L 2224/04026 (2013.01); H01L 2224/05666 (2013.01); H01L 2224/05671 (2013.01); H01L 2224/131 (2013.01); H01L 2224/16225 (2013.01); H01L 2224/24146 (2013.01); H01L 2224/29082 (2013.01); H01L 2224/29083 (2013.01); H01L 2224/29111 (2013.01); H01L 2224/29139 (2013.01); H01L 2224/29155 (2013.01); H01L 2224/32145 (2013.01); H01L 2224/32503 (2013.01); H01L 2224/33181 (2013.01); H01L 2224/48225 (2013.01); H01L 2224/73204 (2013.01); H01L 2224/73217 (2013.01); H01L 2224/73227 (2013.01); H01L 2224/73253 (2013.01); H01L 2224/73259 (2013.01); H01L 2224/73265 (2013.01); H01L 2224/73267 (2013.01); H01L 2224/82101 (2013.01); H01L 2224/83005 (2013.01); H01L 2224/8381 (2013.01); H01L 2224/83193 (2013.01); H01L 2224/83204 (2013.01); H01L 2224/83825 (2013.01); H01L 2224/83948 (2013.01); H01L 2224/92 (2013.01); H01L 2224/9202 (2013.01); H01L 2224/92144 (2013.01); H01L 2224/92244 (2013.01); H01L 2224/94 (2013.01); H01L 2225/06517 (2013.01); H01L 2924/00014 (2013.01); H01L 2924/1033 (2013.01); H01L 2924/10253 (2013.01); H01L 2924/12041 (2013.01); H01L 2924/12042 (2013.01); H01L 2924/1461 (2013.01); H01L 2924/15311 (2013.01); H01L 2924/181 (2013.01); H01L 2924/3512 (2013.01); H01L 2933/0066 (2013.01)

(58) Field of Classification Search
CPC . H01L 2224/16225; H01L 2224/24146; H01L 2224/29082; H01L 2224/29083; H01L 2224/29111; H01L 2224/29139; H01L 2224/29155; H01L 2224/32503; H01L 2224/32145; H01L 2224/33181; H01L 2224/48225; H01L 2224/73204; H01L 2224/73217; H01L 2224/73227; H01L 2224/73253; H01L 2224/73259; H01L 2224/73265; H01L 2224/73267; H01L 2224/82101; H01L 2224/83005; H01L 2224/83193; H01L 2224/83204; H01L 2224/8381; H01L 2224/83825; H01L 2224/83948; H01L 2224/92; H01L 2224/9202; H01L 2224/92144; H01L 2224/92244; H01L 2224/94; H01L 2225/06517; H01L 23/481; H01L 24/05; H01L 24/13; H01L 24/16; H01L 24/24; H01L 24/29; H01L 24/32; H01L 24/33; H01L 24/48; H01L 24/73; H01L 24/82; H01L 24/83; H01L 24/92; H01L 23/94; H01L 25/0657; H01L 25/50; H01L 2924/00014; H01L 2924/10253; H01L 2924/1033; H01L 2924/12041; H01L 2924/12042; H01L 2924/1461; H01L 2924/15311; H01L 2924/181; H01L 2924/3512; H01L 2933/0066; H01L 33/0079; H01L 2224/13111
USPC .......................................... 257/99, 750, 762
See application file for complete search history.

(56) References Cited

U.S. PATENT DOCUMENTS

| | | | | |
|---|---|---|---|---|
| 6,157,080 | A * | 12/2000 | Tamaki | H01L 21/563 257/738 |
| 6,602,777 | B1 * | 8/2003 | Kao | B23K 35/262 228/180.22 |
| 7,170,100 | B2 * | 1/2007 | Erchak | H01L 25/0753 257/88 |
| 7,692,207 | B2 * | 4/2010 | Erchak | F21K 9/00 257/680 |
| 7,867,881 | B2 | 1/2011 | Meguro et al. | |
| 8,247,836 | B2 | 8/2012 | Donofrio et al. | |
| 2003/0013290 | A1 * | 1/2003 | Greer | H01L 24/11 438/612 |
| 2003/0132271 | A1 | 7/2003 | Kao et al. | |
| 2003/0183944 | A1 * | 10/2003 | Taniguchi | H01L 25/0657 257/777 |
| 2005/0194593 | A1 | 9/2005 | Ramdani et al. | |
| 2007/0215895 | A1 * | 9/2007 | Amoh | H01L 33/60 257/99 |
| 2008/0003777 | A1 | 1/2008 | Slater et al. | |
| 2008/0210971 | A1 * | 9/2008 | Donofrio | H01L 33/0079 257/99 |
| 2009/0181525 | A1 | 7/2009 | Park | |
| 2009/0267096 | A1 | 10/2009 | Kim | |
| 2010/0148174 | A1 | 6/2010 | Nakahata et al. | |
| 2010/0190298 | A1 * | 7/2010 | Kuramoto | H01L 21/187 438/121 |
| 2011/0193056 | A1 | 8/2011 | Wang | |
| 2011/0272726 | A1 | 11/2011 | Kim | |
| 2012/0025206 | A1 | 2/2012 | Nakata et al. | |
| 2012/0187440 | A1 | 7/2012 | Kim | |
| 2013/0020596 | A1 | 1/2013 | Kim | |
| 2013/0175541 | A1 | 7/2013 | Park et al. | |
| 2013/0221393 | A1 | 8/2013 | Mao et al. | |
| 2013/0256918 | A1 * | 10/2013 | Tomohiro | H01L 25/00 257/777 |
| 2014/0077251 | A1 | 3/2014 | Kim | |
| 2014/0097534 | A1 * | 4/2014 | Chang | H01L 23/49811 257/737 |
| 2014/0353808 | A1 * | 12/2014 | Hosseini | H01L 23/49575 257/676 |
| 2015/0008253 | A1 * | 1/2015 | Yoon | B23K 20/026 228/179.1 |
| 2015/0236229 | A1 | 8/2015 | Kim | |
| 2016/0218074 | A1 * | 7/2016 | Seddon | H01L 24/11 |

FOREIGN PATENT DOCUMENTS

| | | |
|---|---|---|
| CN | 1943045 A | 4/2007 |
| CN | 103715178 A | 4/2014 |
| EP | 0985486 A1 | 3/2000 |
| EP | 2466658 A2 | 6/2012 |
| JP | 2005-007412 A | 1/2005 |
| JP | 2006-005262 A | 1/2006 |
| JP | 2006-237637 A | 9/2006 |
| JP | 2007-152418 A | 6/2007 |
| JP | 2008016843 A | 1/2008 |
| JP | 2010-272774 A | 12/2010 |
| JP | 2011187782 A | 9/2011 |
| KR | 2007-0025081 A | 3/2007 |
| KR | 0718169 B1 | 5/2007 |
| KR | 20140043131 A | 4/2014 |
| TW | 540276 B | 7/2003 |

(56) References Cited

FOREIGN PATENT DOCUMENTS

| TW | 200927950 A | 7/2009 |
|---|---|---|
| WO | WO-2005036705 A1 | 4/2005 |
| WO | WO-2013/140936 A1 | 9/2013 |

OTHER PUBLICATIONS

Siewert et al., "Database for Solder Properties with Emphasis on New Lead-free Solders: Properties of Lead-Free Solders, Release 4.0". National Institute of Standards and Technology & Colorado School of Mines (Feb. 11, 2002).*

Chromik et al., "Measuring the Mechanical Properties of Pb—Free Solder and Sn—Based Intermetallics by Nanoindentation". J O M (Jun. 2003) pp. 66-69.*

Chen et al., "Elasticity modulus, hardness and fracture toughness of Ni3Sn4 intermetallic thin films". Materials Science and Engineering A423. pp. 107-110 (May 15, 2006).*

C.M.L. Wu, et al. "Microstructure and Mechanical Properties of New-Lead-Free Sn—Cu—RE Solder Alloys", Journal of Electronic Materials, vol. 31, No. 9, (2002).

C.M.T. Law, et al. "Microstructure, Solderability, and Growth of Intermetallic Compounds of Sn—Ag—Cu—RE Lead-Fee Solder Alloys", Journal of Electronic Materials, vol. 35, No. 1, (2006).

H.Y.Chuang, et al., "Elimination of voids in reactions between Ni and Sn: A novel effect of silver", Scripta Materialia 66 (2012), pp. 171-174.

Sinn-Wen Chen et al., "Phase Diagrams of Pb—Free Solders and their Related Materials Systems", Springer Science+Buisness Media, LLC Sep. 1, 2006, J Mater Sci: Mater Electron (2007) 18:19-37.

H.Q.Dong, et al., "Thermodynamic reassessment of Au—Ni—Sn ternary system", CALPHAD: Computer Coupling of Phase Diagrams and Thermochemistry 43 (2013), pp. 61-70.

J.J. Yu et al., "Effects of Ag Concentration of the Ni—Sn Interfacial Reaction for 3D-IC Applications", IEEE International Symposium on Advanced Packaging Materials IEEE Catalog No. CFP13MPP-USB, ISBN 978-1-4673-6091-3, Session 3-4 (Paper 25), pp. 113-120.

Chuang, et al. "Critical New Issues Relating to Interrfacial Reactions Arising from Low Solder Volume in 3D IC Packaging", Electronic Components and Technology Conference, IEEE, pp. 1723-1728, (2011).

Schmetterer, et al. "Phase Equilibria in the Ag—Ni—Sn System: Isothermal Sections", Journal of Electronic Materials, vol. 36, No. 11, pp. 1415-1428, (2007).

Chevalier "A Thermodynamic Evaluation of the Ag—Sn System", Elsevier Science Publishers B.V., vol. 136, pp. 45-54, (1988).

"Shear Strength", Wikipedia, The Free Encyclopedia, Retrieved from Internet, pp. 1-3, (2014).

"MIL-STD-883E Method 2019.5 Die Shear Strength", Department of Defense, pp. 1-4, (1996).

Partial Search Report dated Jan. 27, 2016 issued in corresponding European Application No. 15170728.8.

Chang, et al. "Dual-phase solid-liquid interdiffusion bonding, a solution for the die attachment of WBG," 14th International Conference on Electronic Materials and Packaging, pp. 1-5 (2012).

Gur, et al. "Reactive Isothermal Solidification in the Ni—Sn System," Acta Mater. vol. 46, No. 14, pp. 4917-4923 (1998).

Bader, et al. "Rapid Formation of the Intermetallic Compounds by Interdiffusion in the Cu—Sn and Ni—Sn Systems," Acta Metal. Mater., vol. 43, No. 1, pp. 329-337 (1995).

Extended European Search Report dated Jun. 7, 2016 issued in corresponding European Patent Application No. 15170728.8.

Chinese Office Action dated Jun. 26, 2018 for corresponding Chinese Application No. 201510161903.2 (with translation).

Chinese Office Action dated Feb. 11, 2019 for corresponding Chinese Application No. 201510161903.2.

Result of Consulation issued by the European Patent Office dated Feb. 8, 2019 for corresponding European Application No. 15170728.8.

* cited by examiner

< COMPARISON EXAMPLE >

< EMBODIMENT >

△ : INDENTATION POSITION

SEMICONDUCTOR DEVICE AND METHOD OF MANUFACTURING THE SAME

CROSS REFERENCE TO RELATED APPLICATION

This application claims the benefit of Korean Patent Application No. 10-2014-0105430, filed on Aug. 13, 2014, in the Korean Intellectual Property Office, the disclosure of which is incorporated herein in its entirety by reference.

BACKGROUND

1. Field

Example embodiments relate to semiconductor devices and methods of manufacturing the semiconductor devices.

2. Description of the Related Art

Of bonding technologies for the manufacture of semiconductor devices, a bonding technology (e.g., wafer bonding) using a solder material may be performed at a relatively low temperature that is less than 450° C. and may provide an improved bonding strength. A gold-tin (Au—Sn) solder has desirable adhesive strength and corrosion resistance, compared to a softer solder, as well as having relatively high electrical conductivity and improved thermal conductivity. Also, the Au—Sn solder is resistant to thermal fatigue, does not contain lead (Pb) that is subject to environmental regulations, and may be melted without a flux. However, in the case of the Au—Sn solder, prices may rise due to the inclusion of Au, controlling a composition ratio between Au and Sn may be difficult, and a bonding temperature is relatively high.

SUMMARY

Example embodiments provide semiconductor devices that include bonding structures having improved bonding strength and bonding reliability, and methods of manufacturing the semiconductor devices.

Example embodiments also provide semiconductor devices that include bonding structures for preventing or inhibiting defects, e.g., voids, and mechanical strength degradation due to brittleness, and methods of manufacturing the semiconductor devices.

Example embodiments also provide semiconductor devices that include bonding structures that are advantageous in terms of cost reduction and ease of manufacturing, and methods of manufacturing the semiconductor devices.

Example embodiments also provide methods of manufacturing semiconductor devices by using a wafer bonding technology and semiconductor devices manufactured by the methods.

Additional aspects will be set forth in part in the description which follows and, in part, will be apparent from the description, or may be learned by practice of example embodiments.

According to example embodiments, a semiconductor device includes a base substrate, and a semiconductor chip mounted on the base substrate, the semiconductor chip including a first layer structure and a second layer structure opposite to the first layer structure, at least one of the first and second layer structures including a semiconductor device portion, and a bonding structure between the first layer structure and the second layer structure, the bonding structure including a silver-tin (Ag—Sn) compound and a nickel-tin (Ni—Sn) compound.

The bonding structure may further include pure Ni.

The Ag—Sn compound may include $Ag_3Sn$, and the Ni—Sn compound may include $Ni_3Sn_4$.

The bonding structure may include an intermediate layer including $Ag_3Sn$ and the $Ni_3Sn_4$, a first Ni layer between the intermediate layer and the first layer structure, and a second Ni layer between the intermediate layer and the second layer structure.

The Ni—Sn compound may further include $Ni_3Sn$.

The Ag content in the bonding structure may be about 0.5 wt % to about 23.1 wt %.

The semiconductor device portion may include a light-emitting device portion.

The first layer structure may include a silicon (Si) substrate, the second layer structure may include the light-emitting device portion, and the light-emitting device portion may include a Group III-V semiconductor.

The first layer structure may include a first substrate and a first semiconductor device portion on the first substrate, and the second layer structure may include a second substrate and a second semiconductor device portion on the second substrate.

At least one third layer structure may be bonded onto the second layer structure.

A die shear strength of the bonding structure may be 32 MPa or more.

A re-melting temperature of the bonding structure may be 350° C. or more.

An average elastic modulus of an intermetallic compound in the bonding structure layer may be 124 GPa to 152 GPa.

An average hardness of an intermetallic compound in the bonding structure may be 4.5 GPa to 9 GPa.

According to example embodiments, a method of manufacturing a semiconductor device includes forming a first metal layer on a first substrate structure, the first metal layer including a first nickel (Ni) layer and a first tin (Sn) layer, forming a second metal layer on a second substrate structure, the second metal layer including a second Ni layer, forming a capping layer between the first and second metal layers, the capping layer including silver (Ag), and forming a bonding structure including bonding the first substrate structure of the first metal layer to the second substrate structure of the second metal layer, and forming an intermediate layer between the first metal layer and the second metal layer by a reaction between the first and second metal layers and the capping layer, the intermediate layer including an intermetallic compound.

Forming the second metal layer may include forming a second Sn layer on the second Ni layer.

Forming the capping layer may include forming a first Ag layer on the first metal layer, and forming a second Ag layer on the second metal layer.

The first Ag layer may be formed to contact the first Sn layer, and the second Ag layer may be formed to contact the second Ni layer.

The second metal layer may include a second Sn layer contacting the second Sn layer.

The bonding structure may include $Ag_3Sn$, $Ni_3Sn_4$, and Ni.

Forming the bonding structure may include forming the intermediate layer including $Ag_3Sn$ and the $Ni_3Sn_4$, forming a first residual Ni layer between the intermediate layer and the first substrate structure, and forming a second residual Ni layer between the intermediate layer and the second substrate structure.

The bonding structure may further include $Ni_3Sn$.

Forming the bonding structure may be performed at a temperature of 300° C. or less.

Forming the bonding structure may be performed by using a pressure of 0.5 MPa or less.

The method may further include forming a semiconductor device portion in at least one of the first and second substrate structures.

Forming the semiconductor device portion may include forming at least one light-emitting device portion.

One of the first metal layer and the second metal layer may be formed on a silicon (Si) substrate, and the other of the first metal layer and the second metal layer may be formed on one selected from a GaN substrate, a SiC substrate, a GaAs substrate, and a sapphire substrate.

Each of the first and second metal layers may be formed on a wafer-level substrate.

The method may further include forming a plurality of semiconductor chips by dividing a stacked structure based on chip units, the stacked structure including the first and second substrate structures and the bonding structure therebetween, and mounting at least one of the plurality of semiconductor chips on a base substrate.

The method may further include modifying a stacked structure by removing at least a portion of the first substrate structure, the stacked structure including the first and second substrate structures and the bonding structure therebetween, forming a plurality of semiconductor chips by dividing the modified stacked structure based on chip units, and mounting at least one of the plurality of semiconductor chips on a base substrate.

According to example embodiments, a semiconductor chip includes a bonding layer between a first layer structure and a second layer structure, the bonding layer including a silver-tin (Ag—Sn) compound and a nickel-tin (Ni—Sn) compound.

The Ag—Sn compound may include $Ag_3Sn$, and the Ni—Sn compound may include $Ni_3Sn_4$.

The bonding layer may include an intermediate layer including the $Ag_3Sn$ and the $Ni_3Sn_4$, a first layer between the intermediate layer and the first layer, the first layer including pure Ni, and a second layer between the intermediate layer and the second layer, the second layer including pure Ni.

The Ni—Sn compound may further include $Ni_3Sn$.

The Ag content in the bonding layer may be about 0.5 wt % to about 23.1 wt %.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
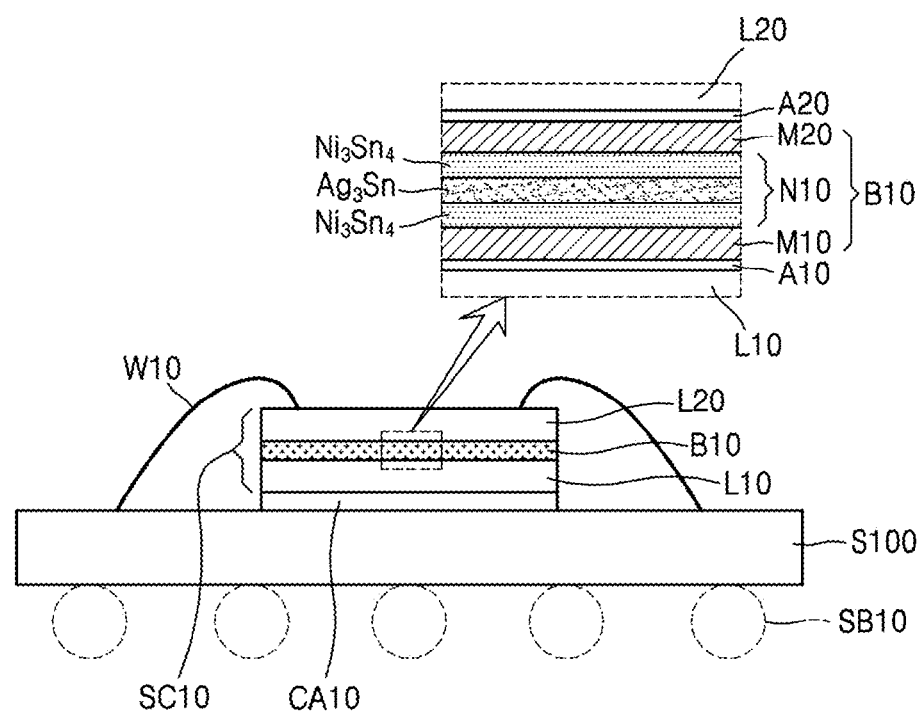
FIG. 1 is a cross-sectional view of a semiconductor device according to example embodiments.

Various example embodiments will now be described more fully with reference to the accompanying drawings in which example embodiments are shown.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Reference will now be made in detail to embodiments, examples of which are illustrated in the accompanying drawings. Widths and thicknesses of layers or regions illustrated in the drawings are exaggerated for clarity. Like reference numerals refer to like elements throughout.

FIG. 1 is a cross-sectional view of a semiconductor device according to example embodiments. The semiconductor device of FIG. 1 may be referred to as a semiconductor device package.

Referring to FIG. 1, a semiconductor chip SC10 may be mounted on a base substrate S100. The base substrate S100 may be a package substrate. A chip adhesive layer CA10 may be disposed between the base substrate S100 and the semiconductor chip SC10 to attach the semiconductor chip SC10 to the base substrate S100. A bonding wire W10 may be provided to electrically connect the semiconductor chip SC10 to the base substrate S100. Although not illustrated in FIG. 1, a molding compound may be further disposed on the base substrate S100 to cover the semiconductor chip SC10 and the bonding wire W10.

The semiconductor chip SC10 may include a first layer structure L10, a second layer structure L20 that is opposite to the first layer structure L10, and a bonding structure B10 disposed between the first layer structure L10 and the second layer structure L20. The first layer structure L10 and the second layer structure L20 may be bonded to each other by the bonding structure B10. At least one of the first and second layer structures L10 and L20 may include a semiconductor device portion. For example, the second layer structure L20 itself may be the semiconductor device portion, or the semiconductor device portion may be disposed in the second layer structure L20. The first layer structure L10 may be a silicon (Si) substrate or one of various substrates other than a Si substrate. In some cases, an electrode layer (not shown) may be further disposed between the first layer structure L10 and the chip adhesive layer CA10, and the electrode layer may be regarded as a portion of the first layer structure L10.

The bonding structure B10 may include a silver-tin (Ag—Sn) compound and a nickel-tin (Ni—Sn) compound and may further include pure Ni. The Ag—Sn compound may include $Ag_3Sn$, and the Ni—Sn compound may include $Ni_3Sn_4$. In some cases, the Ni—Sn may further include $Ni_3Sn$. Referring to the magnified portion of the bonding structure B10 in FIG. 1, the bonding structure B10 may include an intermediate bonding layer N10, a lower metal layer M10, and an upper metal layer M20. The lower metal layer M10 may be disposed between the intermediate bonding layer N10 and the first layer structure L10. The upper metal layer M20 may be disposed between the intermediate bonding layer N10 and the second layer structure L20. The intermediate bonding layer N10 may include $Ag_3Sn$ and $Ni_3Sn_4$.

In example embodiments, an $Ag_3Sn$ area in the intermediate bonding layer N10 may be a central thickness portion of the intermediate bonding layer N10 or around the central thickness portion of the intermediate bonding layer N10. The $Ag_3Sn$ area may have a continuous layer structure as illustrated in FIG. 1, but may have a discontinuous structure, for example, a plurality of island structures. In addition, an $Ni_3Sn_4$ area may be on and under the $Ag_3Sn$ area (or around the $Ag_3Sn$ area). That is, the $Ni_3Sn_4$ area may be disposed between the $Ag_3Sn$ area and the lower metal layer M10 and between the $Ag_3Sn$ area and the upper metal layer M20.

The lower metal layer M10 may include Ni. Similar to the lower metal layer M10, the upper metal layer M20 may also include Ni. For example, both the lower metal layer M10 and the upper metal layer M20 may be Ni layers. In example embodiments, the lower metal layer M10 may be referred to as a first Ni layer, and the upper metal layer M20 may be referred to as a second Ni layer.

In addition, a first adhesive layer A10 may be disposed between the lower metal layer M10 and the first layer structure L10, and a second adhesive layer A20 may be disposed between the upper metal layer M20 and the second layer structure layer L20. The first adhesive layer A10 and the second adhesive layer A20 may be referred to as an adhesion-promoting layer and may have material and characteristics that are different from those of the chip adhesive layer CA10. The first adhesive layer A10 and the second adhesive layer A20 may be formed of, for example, a metal, (e.g., Ti or Cr). The first and second adhesive layers A10 an A20 may be included in the bonding structure B10. That is, the intermediate bonding layer N10, the lower metal layer M10, the upper metal layer M20, the first adhesive layer A10, and the second adhesive layer A20 may constitute the bonding structure B10.

According to necessity, a plurality of solder balls SB10 may be disposed under the lower surface of the base substrate S100. The plurality of solder balls SB10 may be elements for electrical connection with a printed circuit board (PCB) (not shown) that is disposed under the plurality of solder balls SB10.

Figure 2:
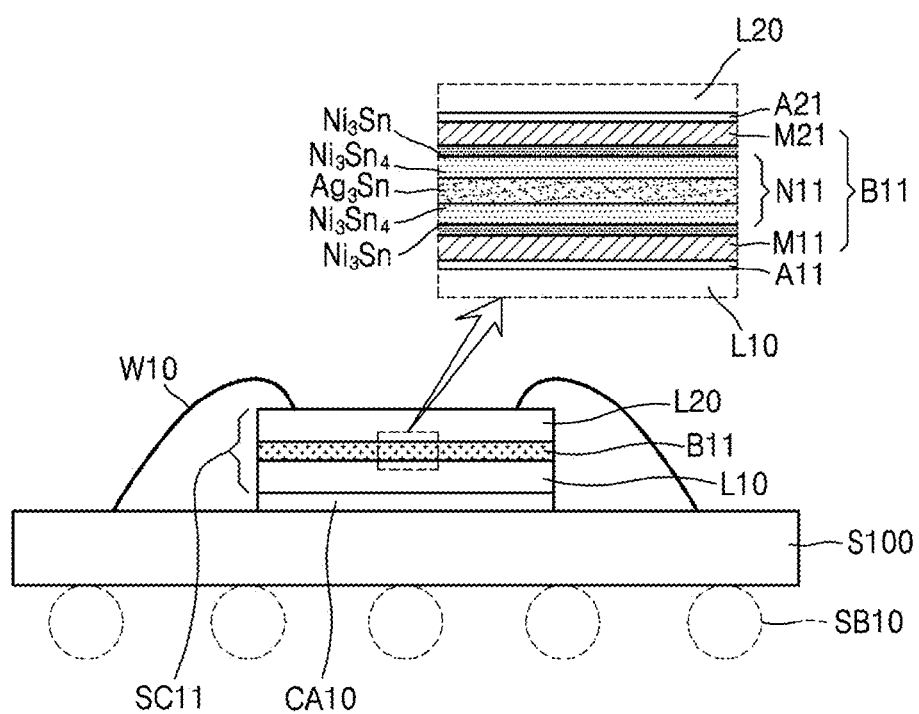
FIG. 2 is a cross-sectional view of a semiconductor device according to example embodiments.

According to example embodiments, the bonding structure B10 of FIG. 1 may further include $Ni_3Sn$, as illustrated in FIG. 2.

FIG. 2 is a cross-sectional view of a semiconductor device according to example embodiments.

Referring to the magnified portion of a bonding structure B11 in FIG. 2, an intermediate bonding layer N11 of the bonding structure B11 may further include an $Ni_3Sn$ area. In example embodiments, the $Ni_3Sn$ area may be disposed between a lower metal layer M11 and an $Ni_3Sn_4$ area adjacent to the lower metal layer M11 and between an upper metal layer M21 and an $Ni_3Sn_4$ area adjacent to the upper metal layer M21. Accordingly, $Ni_3Sn$ may contact the lower metal layer M11 and the upper metal layer M21. In FIG. 2, a reference numeral SC11 indicates a semiconductor chip, a reference numeral A11 indicates a first adhesive layer, and a reference numeral A21 indicates a second adhesive layer.

Although the semiconductor chips SC10 and SC11 of FIGS. 1 and 2 are packaged with a wire bonding method, a packaging method may be changed. For example, the semiconductor chip SC10 and SC11 of FIGS. 1 and 2 may be packaged with a flip-chip method, like a semiconductor chip SC10 illustrated in FIG. 3.

Figure 3:
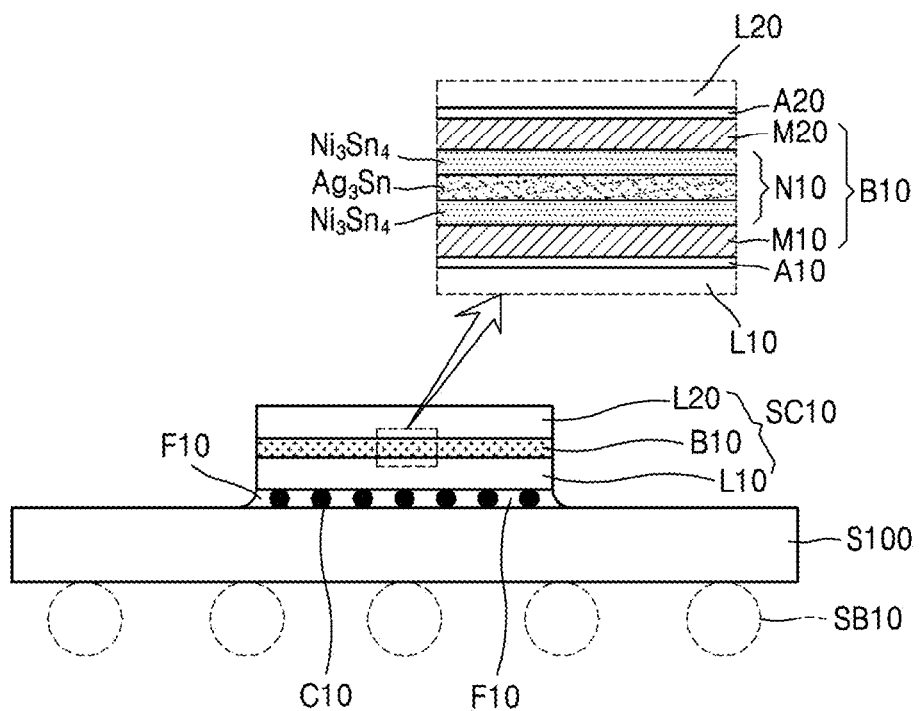
FIG. 3 is a cross-sectional view of a semiconductor device according to example embodiments.

FIG. 3 is a cross-sectional view of a semiconductor device according to example embodiments.

Referring to FIG. 3, a semiconductor chip SC10 may be mounted on a base substrate S100 by using a flip-chip method. In example embodiments, a plurality of connection elements C10 may be disposed between the base substrate S100 and the semiconductor chip SC10. The plurality of connection elements C10 may be, for example, solder bumps. An underfill material F10 filling spaces between the plurality of connection elements C10 may be provided between the base substrate S100 and the semiconductor chip SC10.

The semiconductor chip SC10 may include a first layer structure L10, a second layer structure L20, and a bonding structure B10 disposed between the first layer structure L10 and the second layer structure L20. At least one of the first and second layer structures L10 and L20 may include a semiconductor device portion. The bonding structure B10 may have a structure that is the same as or similar to the bonding structure B10 illustrated in FIG. 1.

Figure 4:
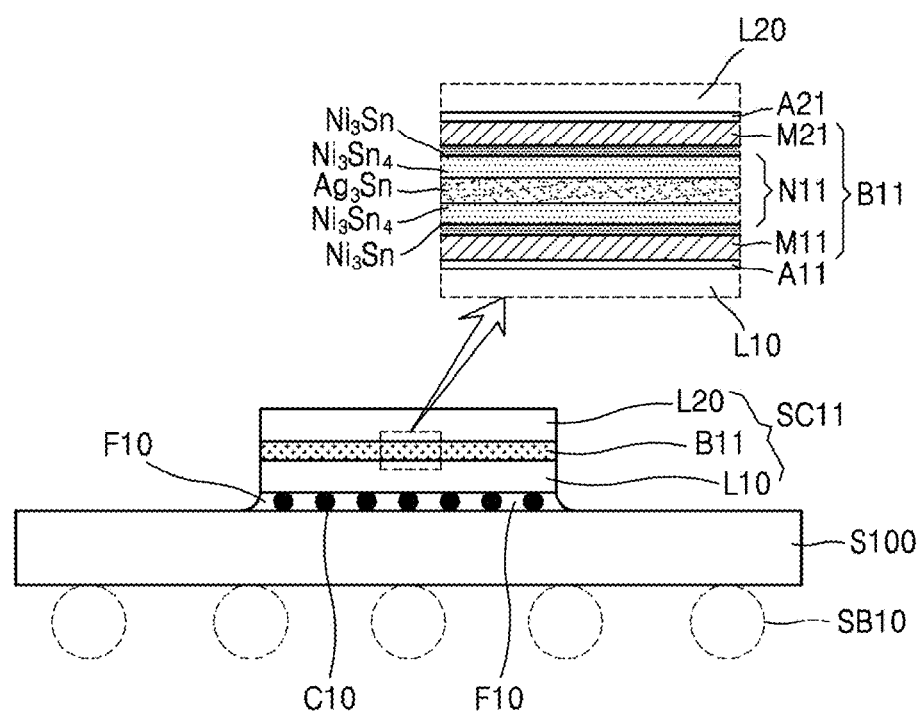
FIG. 4 is a cross-sectional view of a semiconductor device according to example embodiments.

According to example embodiments, the bonding structure B10 of FIG. 3 may further include $Ni_3Sn$, as illustrated in FIG. 4.

FIG. 4 is a cross-sectional view of a semiconductor device according to example embodiments.

Referring to the magnified portion of a bonding structure B11 in FIG. 4, an intermediate bonding layer N11 of the bonding structure B11 may further include an $Ni_3Sn$ area. The bonding structure B11 of FIG. 4 may have a structure that is the same as or similar to the bonding structure B11 illustrated in FIG. 2.

In the bonding structures B10 and B11 of FIGS. 1 through 4, an Ag content may be about 0.5 wt % to about 23.1 wt %. For example, the Ag content may be in the range of about 1 wt % to about 10 wt %. The strength and hardness of the bonding structures B10 and B11 may be controlled by adjusting the Ag content. The die shear strength of the bonding structures B10 and B11 may be about 32 MPa or more. For example, the die shear strength of the bonding structures B10 and B11 may be about 40 MPa or more. In some cases, the die shear strength of the bonding structures B10 and B11 may be about 50 MPa or more. An average elastic modulus of the entire intermetallic compound in each of the bonding structures B10 and B11 may be less than about 152 GPa. For example, the average elastic modulus of the entire intermetallic compound may have a value between about 124 GPa and about 152 GPa.

An average hardness of the entire intermetallic compound in each of the bonding structures B10 and B11 may be less than about 9 GPa as measured by the Vickers hardness scale. For example, the average hardness of the entire intermetallic compound may have a value between about 4.5 and about 9 GPa. Because the bonding structures B10 and B11 have elastic modulus values and hardness values, stated above, the bonding structures B10 and B11 each may have an appropriate level of softness and desirable strength and reliability. A re-melting temperature of each of the bonding structures B10 and B11 may be about 350° C. or more. Accordingly, the bonding structures B10 and B11 may have desirable mechanical bonding strength, desirable thermal stability, and desirable long-term bonding reliability.

An Ni—Sn solder has more price competitiveness than an Au—Sn solder because the price of Ni is about ⅟₅₀ of the price of Au, and may lower a process temperature because the eutectic temperature (about 221° C.) of Ni—Sn is lower than that (about 280° C.) of Au—Sn. In addition, an Ag—Sn compound (intermetallic compound) may suppress or prevent the formation of a void in the bonding structures B10 and B11, and may prevent or inhibit brittleness and improve bonding strength and reliability by controlling the elastic modulus and hardness of the bonding structures B10 and B11. These functions will be described later.

Furthermore, the bonding structure B10 (or B11) may be distinguished from the chip adhesive layer CA10 and the connection elements C10 in that the bonding structure B10 (or B11) is placed in the middle (the inside) of the semiconductor chip SC10 (or SC11) rather than the outside of the semiconductor chip SC10 (or SC11). The bonding structures B10 and B11 may be formed through wafer bonding during manufacturing the semiconductor chips SC10 and SC11. Accordingly, the bonding structures B10 and B11 may be structures formed in a wafer-level process and may be distinguished from the chip adhesive layer CA10 and the connection elements C10, which are formed in a chip-level process and a packaging process.

Figure 5:
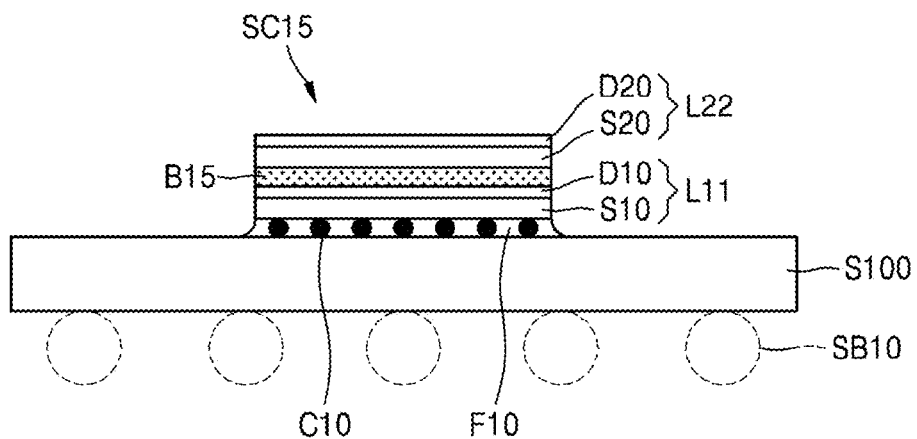
FIG. 5 is a cross-sectional view of a semiconductor device according to example embodiments.

FIG. 5 is a cross-sectional view of a semiconductor device according to example embodiments.

Referring to FIG. 5, a semiconductor chip SC15 may include a first layer structure L11, a second layer structure L22, and a bonding structure B15 disposed between the first layer structure L11 and the second layer structure L22. The first layer structure L11 may include a first substrate S10 and a first semiconductor device portion D10 disposed on the first substrate S10. The second layer structure L22 may include a second substrate S20 and a second semiconductor device portion D20 disposed on the second substrate S20. The first substrate S10 and the second substrate S20 may be different substrates, and the first semiconductor device portion D10 and the second semiconductor device portion D20 may also be different device portions. The first substrate S10 and the second substrate S20 may be bonded to each other with the bonding structure B15 interposed therebetween. The bonding structure B15 may have the same configuration as the bonding structure B11 of FIGS. 1 and 3 and the bonding structure B11 of FIGS. 2 and 4.

In example embodiments, a first adhesive layer (not shown) may be disposed between the bonding structure B15 and the first layer structure L11, and a second adhesive layer (not shown) may be disposed between the bonding structure B15 and the second layer structure L22. The first and second adhesive layers (not shown) may be the same as the first and second adhesive layers A10 and A20 of FIGS. 1 and 3 or the first and second adhesive layers A11 and A21 of FIGS. 2 and 4. The first and second adhesive layers (not shown) may be included in the bonding structure B15.

Although not illustrated in FIG. 5, a plurality of through holes (i.e., vias) penetrating the semiconductor chip SC15 may be formed, a plurality of conductive plugs may be formed by filling the plurality of through holes with a conductive material, and the first semiconductor device portion D10 and the second semiconductor device portion D20 may be electrically connected to each other by using the plurality of conductive plugs. A thin insulating film may be formed on inner walls of the through holes to prevent or inhibit an electrical short between the conductive plugs and the bonding structure B15.

As shown in FIG. 5, when the first semiconductor device portion D10 and the second semiconductor device portion D20 are bonded by the bonding structure B15 after forming the first semiconductor device portion D10 on the first substrate S10 and the second semiconductor device portion D10 on the second substrate S20, merits of the first and second substrates S10 and S20 that are different substrates may be utilized, and thus, the semiconductor chip SC15 have various functions and merits may be more easily implemented.

Although the semiconductor chip SC15 of FIG. 5 is mounted on the base substrate S100 by using a flip-chip method, the semiconductor chip SC15 may be mounted with a wire bonding method as shown in FIG. 1.

Figure 6:
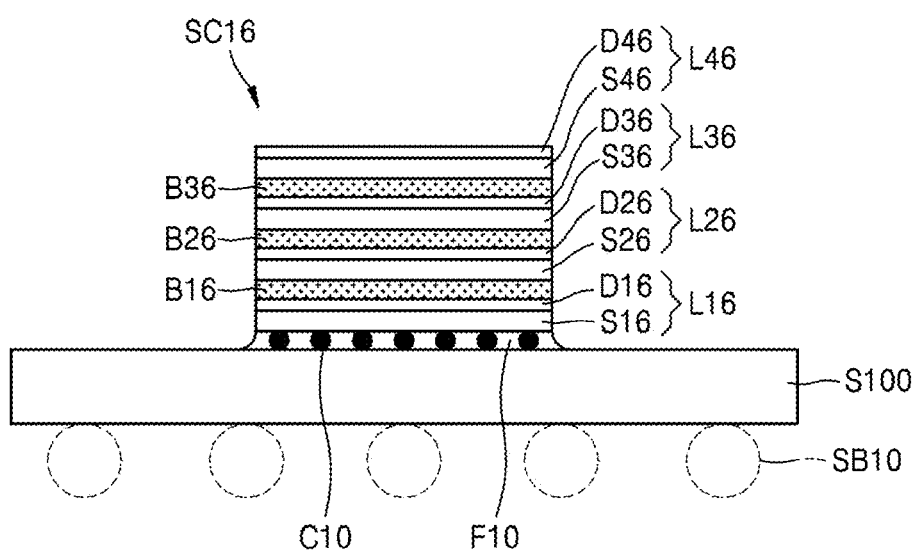
FIG. 6 is a cross-sectional view of a semiconductor device according to example embodiments.

According to example embodiments, the number of layer structures that are included in a semiconductor chip may be increased to three or more. For example, as illustrated in FIG. 6, a semiconductor chip SC16 in which three or more of layer structures, i.e., first through fourth layer structures L16, L26, L36, and L46, are stacked may be mounted on a base substrate S100. The first layer structure L16 may include a first substrate S16 and a first semiconductor device portion D16 formed on the first substrate S16. Similarly, the second layer structure L26 may include a second substrate S26 and a second semiconductor device portion D26, the third layer structure L36 may include a third substrate S36 and a third semiconductor device portion D36, and the fourth layer structure L46 may include a fourth substrate S46 and a fourth semiconductor device portion D46. Bonding structures B16, B26, and B36 may be disposed between the first through fourth layer structures L16, L26, L36, and L46. The bonding structures B16, B26, and B36 may have the same configuration as the bonding structure B10 of FIGS. 1 and 3 or the bonding structure B11 of FIGS. 2 and 4. A bonding layer may be disposed on the upper surface and lower surface of each of the bonding structures B16, B26, and B36.

The semiconductor chips SC10 and SC11 of FIGS. 1 through 4 may include a light emitting device portion. In example embodiments, the semiconductor chip SC10 may be a light emitting device (LED) chip or a laser diode (LD) chip. When the semiconductor chip SC10 of FIG. 1 is an LED chip, a detailed configuration of the semiconductor chip SC10 may be, for example, the same as that illustrated in FIG. 7.

Figure 7:
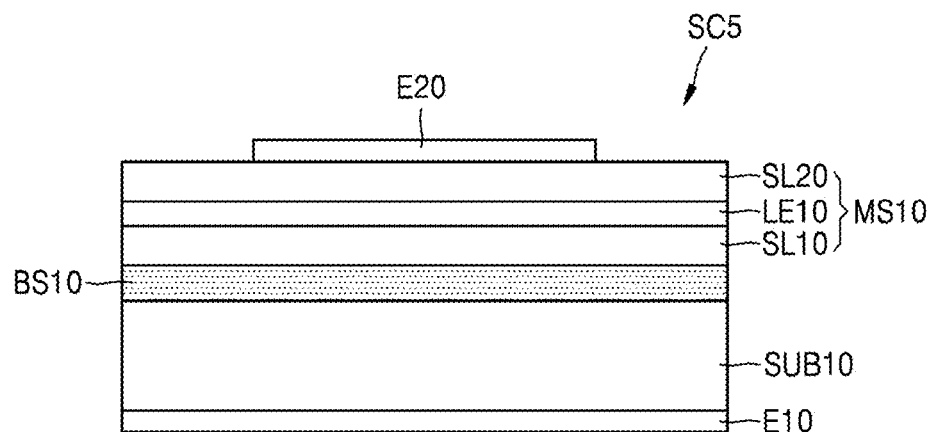
FIG. 7 is a cross-sectional view of a semiconductor chip that may be applied to a semiconductor device, according to example embodiments.

Referring to FIG. 7, a semiconductor chip SC5 may include a multi-layer structure MS10 disposed on a substrate SUB10. The substrate SUB10 may be, for example, a Si substrate. However, the substrate SUB10 may be another substrate than the Si substrate. The multi-layer structure MS10 may include a first conductive type semiconductor layer SL10, a second conductive type semiconductor layer SL20, and a light emitting layer LE10 disposed between the first conductive type semiconductor layer SL10 and the second conductive type semiconductor layer SL20. The multi-layer structure MS10 may include a Group III-V semiconductor, for example, a GaN-based semiconductor. In example embodiments, the first conductive type semiconductor SL10 may include a p-type GaN-based semiconductor and the second conductive type semiconductor SL20 may include an n-type GaN-based semiconductor.

Alternatively, the first conductive type semiconductor SL10 may include an n-type GaN-based semiconductor and the second conductive type semiconductor SL20 may include a p-type GaN-based semiconductor. The light emitting layer LE10 may also include a GaN-based semiconductor. The light emitting layer LE10 may have, for example, a multiple quantum well (MQW) structure. A first electrode element E10 may be disposed on a lower surface of the substrate SUB10, and a second electrode element E20 may be disposed on the second conductive semiconductor layer SL20. It may be considered that the substrate SUB10 and the first electrode element E10 form a single layer structure or a single substrate structure.

A bonding structure BS10 may be disposed between the substrate SUB10 and the multi-layer structure MS10. The bonding structure BS10 may have a configuration that is the same as or similar to those of the bonding structures B10 and B11 described with reference to FIGS. 1 through 4.

An LED using a semiconductor material, for example, a Group III-V semiconductor (e.g., GaN-based semiconductor), may have a relatively small size, a relatively light weight, and a relatively long lifespan. Recently, a relatively high power and relatively high brightness LED receives a lot of attention, and thus, a vertical LED having an efficient current-applying structure has been proposed. A vertical LED having a structure like that shown in FIG. 7 may obtain an improved efficiency and output compared to a horizontal LED. In addition, the vertical LED having a structure like that shown in FIG. 7 is easy to cool compared to the horizontal LED, and thus may more easily dissipate heat generated during operation. A wafer bonding process may be required to manufacture the vertical LED having a structure like that shown in FIG. 7. For example, after growing a semiconductor layer on a growth substrate (e.g., a sapphire, GaN, or SiC substrate), another substrate may be attached onto the semiconductor layer, and then, the growth substrate may be removed and remaining subsequent processes may be performed.

In example embodiments, a process of attaching another substrate onto the semiconductor layer may be performed with a wafer scale. Next, a dicing process of dividing the substrate (wafer) into unit devices may be performed. The semiconductor chip SC5 shown in FIG. 7 may be obtained through such processes. The bonding structure BS10 may be usefully used in manufacturing the semiconductor chip SC5 shown in FIG. 7, for example, a vertical LED. However, a bonding structure like that described above is not limited to the vertical LED and may be widely applied to various semiconductor devices and electronic devices. For example, the bonding structure may be applied to various fields, e.g., microelectro-mechanical systems (MEMS), optoelectronic devices, surface-emitting optical devices, display devices, light sources of display devices, automotive electronics, optical communication devices, and power devices, in addition to a general semiconductor chip field.

Figure 8A:
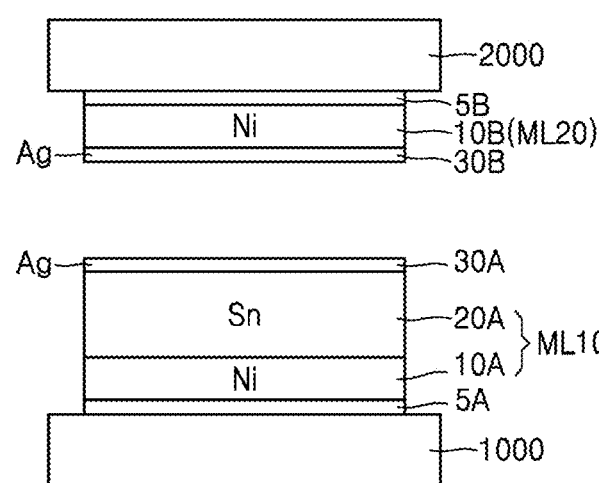
FIGS. 8A through 8C are cross-sectional views illustrating a method of manufacturing a semiconductor device according to example embodiments.
Figure 8B:
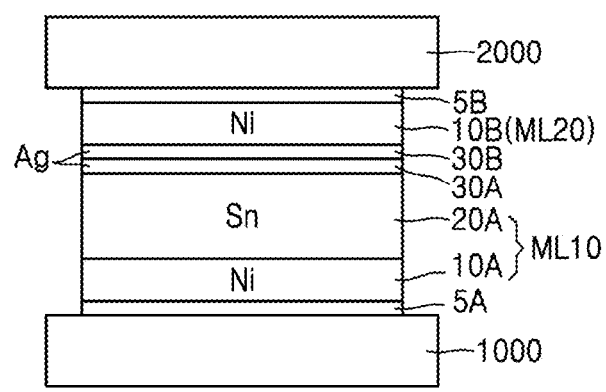
Figure 8C:
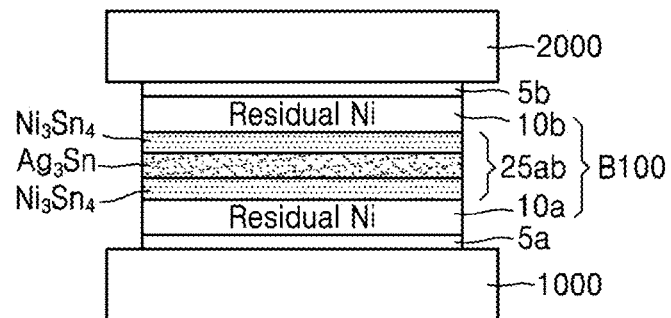

FIGS. 8A through 8C are cross-sectional views illustrating a method of manufacturing a semiconductor device according to example embodiments.

Referring to FIG. 8A, a first metal layer ML10 including a first Ni layer 10A and a first Sn layer 20A may be formed on a first substrate structure 1000. After forming a first adhesive layer 5A on the first substrate structure 1000, the first Ni layer 10A and the first Sn layer 20A may be sequentially formed on the first adhesive layer 5A to thereby form the first metal layer ML10. The first adhesive layer 5A may be referred to as an adhesion-promoting layer. The first adhesive layer 5A may be formed of Ti or Cr. Next, a first capping layer 30A covering the first metal layer ML10 may be formed. The first capping layer 30A may be a first Ag layer including Ag.

A second metal layer ML20 including a second Ni layer 10B may be formed on a second substrate structure 2000. The second Ni layer 10B may be the second metal layer ML20. After forming a second adhesive layer 5B on the second substrate structure 2000, the second metal layer ML20 may be formed on the second adhesive layer 5B. The second adhesive layer 5B may be referred to as an adhesion-promoting layer. The second adhesive layer 5B may be formed of Ti or Cr. Next, a second capping layer 30B covering the second metal layer ML20 may be formed. The second capping layer 30B may be a second Ag layer including Ag.

After reversing the second substrate structure 2000, the reversed second substrate structure 2000 may be positioned on the first substrate structure 1000. In example embodiments, the second metal layer ML20 of the second substrate structure 2000 may be disposed to face the first metal layer ML10 of the first substrate structure 1000. The first and second capping layers 30A and 30B may be between the first metal layer ML10 and the second metal layer ML20.

The first capping layers 30A may suppress or prevent surface oxidation and surface corrosion of the first metal layer ML10, and the second capping layers 30B may suppress and prevent or inhibit surface oxidation and surface corrosion of the second metal layer ML20. The first and second capping layers 30A and 30B may improve surface wettability. Also, the first and second capping layers 30A and 30B may react with Sn of the Sn layer 20A in a subsequent bonding process and thus form an intermetallic compound, and may improve bonding characteristics and physical properties of a bonding portion. This will be described in detail later.

In addition, a ratio of the thickness of the first Sn layer 20A to the sum of the thicknesses of the first and second Ni layers 10A and 10B may be about 1:0.5 through about 1:0.7. That is, a ratio (Sn:Ni) of the volume of the Sn layer 20A to the volume of the first and second Ni layers 10A and 10B, which is required for the formation of a bonding portion, may be about 1:0.5 through about 1:0.7. When such a condition is satisfied, intermetallic compounds may be easily formed through a subsequent bonding process.

Referring to FIG. 8B, a bonding process between the first metal layer ML10 and the second metal layer ML20 may be performed after attaching the first metal layer ML10 and the second metal layer ML20 to each other with the first and second capping layers 30A and 30B interposed therebetween. In example embodiments, the first and second capping layers 30A and 30B may be regarded as a kind of intermediate layer. The bonding process may be performed by using a certain temperature and pressure. By applying a pressure between the first substrate structure 1000 and the second substrate structure 2000 while heating the first and second substrate structures 1000 and 2000 at a certain temperature, a reaction between the first metal layer ML10 and the second metal layer LM20 may be induced, and thus, the first metal layer ML10 and the second metal layer LM20 may be bonded to each other. For example, a bonding process may be performed by using a pressure (relatively low pressure) of about 0.5 MPa or less at a temperature (relatively low temperature) of about 300° C. or less.

A resultant structure of the bonding process is illustrated in FIG. 8C. Referring to FIG. 8C, a bonding structure B100 may be formed by a reaction between the first and second metal layers ML10 and ML20 and the first and second capping layers 30A and 30B. The bonding structure B100 may include an intermediate bonding layer 25ab including an intermetallic compound formed by the reaction between the first and second metal layers ML10 and ML20 and the first and second capping layers 30A and 30B. The intermetallic compound may include an Ag—Sn compound and an Ni—Sn compound. The Ag—Sn compound may include $Ag_3Sn$, and the Ni—Sn compound may include $Ni_3Sn_4$. In addition, the bonding structure B100 may include pure Ni. That is, a portion of the first Ni layer 10A may remain without reaction, and a portion of the second Ni layer 10B may also remain without reaction. First and second residual Ni layers 10a and 10b may correspond to the pure Ni.

Accordingly, the bonding structure B100 may include the intermediate bonding layer 25ab, the first residual Ni layer 10a, and the second residual Ni layer 10b. The first residual Ni layer 10a may be disposed between the intermediate bonding layer 25ab and the first substrate structure 1000. The second residual Ni layer 10b may be disposed between the intermediate bonding layer 25ab and the second substrate structure 2000. The intermediate bonding layer 25ab may include $Ag_3Sn$ and $Ni_3Sn_4$. $Ag_3Sn$ is an output obtained by a reaction between Ag of the first and second capping layers 30A and 30B and Sn of the first Sn layer 20A, and may be a central thickness portion of the intermediate bonding layer 25a or around the central thickness portion of the intermediate bonding layer 25a. The Sn of the first Sn layer 20A may also react with Ni of the second Ni layer 10B to thereby form $Ni_3Sn_4$, and at least some of the formed $Ni_3Sn_4$ may be positioned between an $Ag_3Sn$ area and the second residual Ni layer 10b.

Also, the Sn of the first Sn layer 20A may react with Ni of the first Ni layer 10A to thereby form $Ni_3Sn_4$, and at least some of the formed $Ni_3Sn_4$ may be positioned between the $Ag_3Sn$ area and the first residual Ni layer 10a. The $Ag_3Sn$ area may have a continuous layer structure as illustrated in FIG. 8C, but may have a discontinuous structure, for example, a plurality of island structures. In addition, an $Ni_3Sn_4$ area may be on and under the $Ag_3Sn$ area (or around the $Ag_3Sn$ area). That is, the $Ni_3Sn_4$ area may be disposed between the $Ag_3Sn$ area and the first residual Ni layer 10a and between the $Ag_3Sn$ area and the second residual Ni layer 10b.

In FIG. 8C, a reference numeral 5a and a reference numeral 5b respectively indicate a first adhesive layer and a second adhesive layer after the bonding process. The first adhesive layer 5a may be disposed between the bonding structure B100 and the first substrate structure 1000, and the second adhesive layer 5b may be disposed between the bonding structure B100 and the second substrate structure 2000. The first and second adhesive layers 5a and 5b may be the same as or similar to the first and second adhesive layers 5A and 5B of FIG. 8B. It may be considered that the first and second adhesive layers 5a and 5b are included in the bonding structure B100.

In FIG. 8A, the thickness of the first Ni layer 10A, the thickness of the first Sn layer 20A, and the thickness of the second Ni layer 10B may be, for example, 1000 nm, 2900 nm, and 1000 nm, respectively. The thickness of the first capping layer 30A and the thickness of the second capping layer 30B each may be, for example, about 10 nm to 300 nm. The first and second capping layers 30A and 30B may be Ag layers. In example embodiments, a weight ratio (wt %) of Sn, Ni, and Ag elements that constitute the bonding structure B100 of FIG. 8C may be changed according to the thicknesses of the first and second capping layers 30A and 30B. A weight ratio of Sn:Ni:Ag in the bonding structure B100 may be 54.23:45.24:0.53 when the thickness of the first capping layer 30A and the thickness of the second capping layer 30B each are about 10 nm, may be 53.94:45.0:1.06 when the thickness of the first capping layer 30A and the thickness of the second capping layer 30B each are about 20 nm, and may be 53.66:44.76:1.58 when the thickness of the first capping layer 30A and the thickness of the second capping layer 30B each are about 30 nm.

Also, the ratio of Sn:Ni:Ag in the bonding structure B100 may be 53.10:44.29:2.61 when the thickness of the first capping layer 30A and the thickness of the second capping layer 30B each are about 50 nm, may be 51.75:43.17:5.08 when the thickness of the first capping layer 30A and the thickness of the second capping layer 30B each are about 100 nm, and may be 46.97:39.18:13.84 when the thickness of the first capping layer 30A and the thickness of the second capping layer 30B each are about 300 nm. However, the thicknesses of the above-stated layers and the weight ratios of the above-stated elements are only examples and may be variously changed. The thickness of the first Ni layer 10A and the thickness of the second Ni layer 10B may be different from each other, and the thickness of the first capping layer 30A and the thickness of the second capping layer 30B may also be different from each other.

Figure 9A:
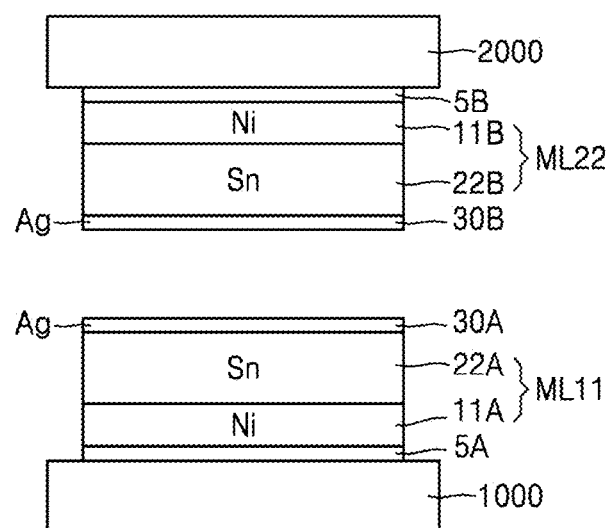
FIGS. 9A through 9C are cross-sectional views illustrating a method of manufacturing a semiconductor device according to example embodiments.
Figure 9B:
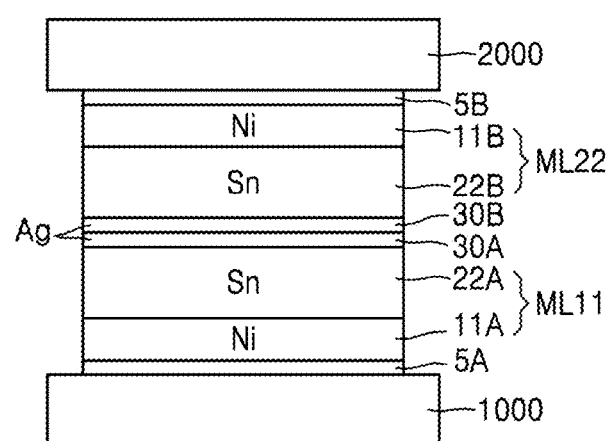
Figure 9C:
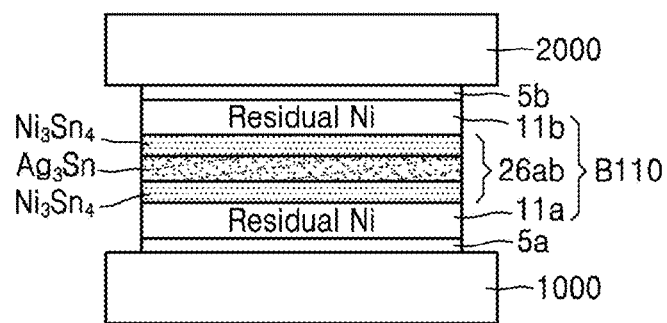

FIGS. 9A through 9C are cross-sectional views illustrating a method of manufacturing a semiconductor device according to example embodiments.

Referring to FIG. 9A, a first metal layer ML11 may be formed on a first adhesive layer 5A after forming the first adhesive layer 5A on a first substrate structure 1000, similar to FIG. 8A. The first metal layer ML11 may include a first Ni layer 11A and a first Sn layer 22A, sequentially formed on the first adhesive layer 5A. Next, a first capping layer 30A covering the first metal layer ML11 may be formed. The first capping layer 30A may be a first Ag layer including Ag.

After forming a second adhesive layer 5B on a second substrate structure 2000, a second metal layer ML22 may be formed on the second adhesive layer 5B. The second metal layer ML22 may include a second Ni layer 11B and a second Sn layer 22B, sequentially formed on the second adhesive layer 5B. Next, a second capping layer 30B covering the second metal layer ML22 may be formed. The second capping layer 30B may be a second Ag layer including Ag.

After reversing the second substrate structure 2000, the reversed second substrate structure 2000 may be positioned on the first substrate structure 1000. In example embodiments, the second metal layer ML22 of the second substrate structure 2000 may be disposed to face the first metal layer ML11 of the first substrate structure 1000. The first and second capping layers 30A and 30B may be between the first metal layer ML11 and the second metal layer ML22.

The functions of the first and second capping layers 30A and 30B may be the same as or similar to those described with reference to FIG. 8A. That is, the first capping layers 30A may suppress or prevent surface oxidation and surface corrosion of the first metal layer ML11, and the second capping layers 30B may suppress and prevent surface oxidation and surface corrosion of the second metal layer ML22. The first and second capping layers 30A and 30B may improve surface wettability. Also, the first and second capping layers 30A and 30B may react with Sn of the first and second Sn layers 22A and 22B in a subsequent bonding process and thus form an intermetallic compound, and may improve bonding characteristics and physical properties of a bonding portion.

Because an upper portion of the structure of FIG. 9A is symmetrical to a lower portion thereof, a bonding method used in the method according to the embodiment of FIGS. 9A through 9C may be referred to as a bonding method using a symmetrical structure. However, because an upper portion of the structure of FIG. 8A is asymmetrical to a lower portion thereof, a bonding method used in the method according to the embodiment of FIGS. 8A through 8C may be referred to as a bonding method using an asymmetrical structure. The total volume of the first and second Sn layers 22A and 22B in FIG. 9A may be equal or similar to the volume of the first Sn layer 20A in FIG. 8A. That is, the sum of the thicknesses of the first and second Sn layers 22A and 22B in FIG. 9A may be equal or similar to the thickness of the first Sn layer 20A in FIG. 8A. In addition, the sum of the thicknesses of the first and second Ni layers 11A and 11B in FIG. 9A may be equal or similar to the sum of the thicknesses of the first and second Ni layers 10A and 10B in FIG. 8A. For example, the thickness of the first Ni layer 10A, the thickness of the second Ni layer 10B, the thicknesses of the first Ni layer 11A, and the thickness of the second Ni layer 11B may be equal or similar to one another.

Referring to FIG. 9B, a bonding process between the first metal layer ML11 and the second metal layer ML22 may be performed after attaching the first metal layer ML11 to the second metal layer ML22 with the first and second capping layers 30A and 30B interposed therebetween. In example embodiments, the first and second capping layers 30A and 30B may be regarded as a kind of intermediate layer. The bonding process may be the same as or similar to that described with reference to FIG. 8B.

A resultant structure of the bonding process is illustrated in FIG. 9C. Referring to FIG. 9C, a bonding structure B110 may be formed by a reaction between the first and second metal layers ML11 and ML22 and the first and second capping layers 30A and 30B. The bonding structure B110 may have a structure that is the same as or similar to that of the bonding structure B100 of FIG. 8C. That is, the bonding structure B110 may include an intermediate bonding layer 26ab, a first residual Ni layer 11a, and a second residual Ni layer 11b. The first residual Ni layer 11a may be disposed between the intermediate bonding layer 26ab and the first substrate structure 1000, and the second residual Ni layer 11b may be disposed between the intermediate bonding layer 26ab and the second substrate structure 2000. The intermediate bonding layer 26ab may include $Ag_3Sn$ and $Ni_3Sn_4$. The configuration of the intermediate bonding layer 26ab may be the same as or similar to that of the intermediate bonding layer 25ab of FIG. 8C. In FIG. 9C, a reference numeral 5a and a reference numeral 5b respectively indicate a first adhesive layer and a second adhesive layer after the bonding process.

In FIG. 9A, the thickness of the first Ni layer 11A, the thickness of the first Sn layer 22A, the thickness of the second Sn layer 22B, and the thickness of the second Ni layer 11B may be, for example, 1000 nm, 1450 nm, 1450 nm, and 1000 nm, respectively. The thickness of the first capping layer 30A and the thickness of the second capping layer 30B each may be, for example, about 10 nm to 300 nm. The first and second capping layers 30A and 30B may be Ag layers. In example embodiments, a weight ratio (wt %) of Sn, Ni, and Ag elements that constitute the bonding structure B110 of FIG. 9C may be changed according to the thicknesses of the first and second capping layers 30A and 30B. The weight ratio may be the same as that exemplified with respect to the bonding structure B100 of FIG. 8C. That is, a weight ratio of Sn:Ni:Ag in the bonding structure B110 may be 54.23:45.24:0.53 when the thickness of the first capping layer 30A and the thickness of the second capping layer 30B each are about 10 nm, may be 53.94:45.0:1.06 when the thickness of the first capping layer 30A and the thickness of the second capping layer 30B each are about 20 nm, and may be 53.66:44.76:1.58 when the thickness of the first capping layer 30A and the thickness of the second capping layer 30B each are about 30 nm.

Also, the ratio of Sn:Ni:Ag in the bonding structure B100 may be 53.10:44.29:2.61 when the thickness of the first capping layer 30A and the thickness of the second capping layer 30B each are about 50 nm, may be 51.75:43.17:5.08 when the thickness of the first capping layer 30A and the thickness of the second capping layer 30B each are about 100 nm, and may be 46.97:39.18:13.84 when the thickness of the first capping layer 30A and the thickness of the second capping layer 30B each are about 300 nm. However, the thicknesses of the above-stated layers and the weight ratios of the above-stated elements are only examples and may be variously changed. The thickness of the first Ni layer 11A and the thickness of the second Ni layer 11B may be different from each other, and the thickness of the first capping layer 30A and the thickness of the second capping layer 30B may also be different from each other.

According to example embodiments, the bonding structure B100 of FIG. 8C and the bonding structure B110 of FIG. 9C may further include $Ni_3Sn$. $Ni_3Sn$ may be formed in the bonding structures B100 and B110 by controlling conditions of the bonding process. An example is illustrated in FIG. 10.

Figure 10:
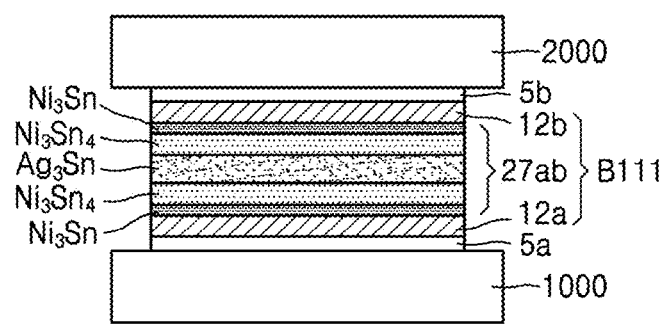
FIG. 10 is a cross-sectional view for explaining a method of manufacturing a semiconductor device according to example embodiments.

FIG. 10 is a cross-sectional view for explaining a method of manufacturing a semiconductor device according to example embodiments.

Referring to FIG. 10, an intermediate bonding layer 27ab of a bonding structure B111 may be formed to further include an $Ni_3Sn$ area. In example embodiments, the $Ni_3Sn$ area may be disposed between a first residual Ni layer 12a and an $Ni_3Sn_4$ area adjacent to the first residual Ni layer 12a and between a second residual Ni layer 12b and an $Ni_3Sn_4$ area adjacent to the second residual Ni layer 12b. Accordingly, $Ni_3Sn$ may contact the first residual Ni layer 12a and the second residual Ni layer 12b. In FIG. 8C, some of $Ni_3Sn_4$ may additionally react with Ni of the first and second residual Ni layers 10a and 10b, and thus, $Ni_3Sn$ may be formed. Similarly, in FIG. 9C, some of $Ni_3Sn_4$ may additionally react with Ni of the first and second residual Ni layers 11a and 11b, and thus, $Ni_3Sn$ may be formed. The bonding structure B111 of FIG. 10 may be the same as or similar to the bonding structure B11 of FIG. 2 and the bonding structure B11 of FIG. 4.

Figure 11:
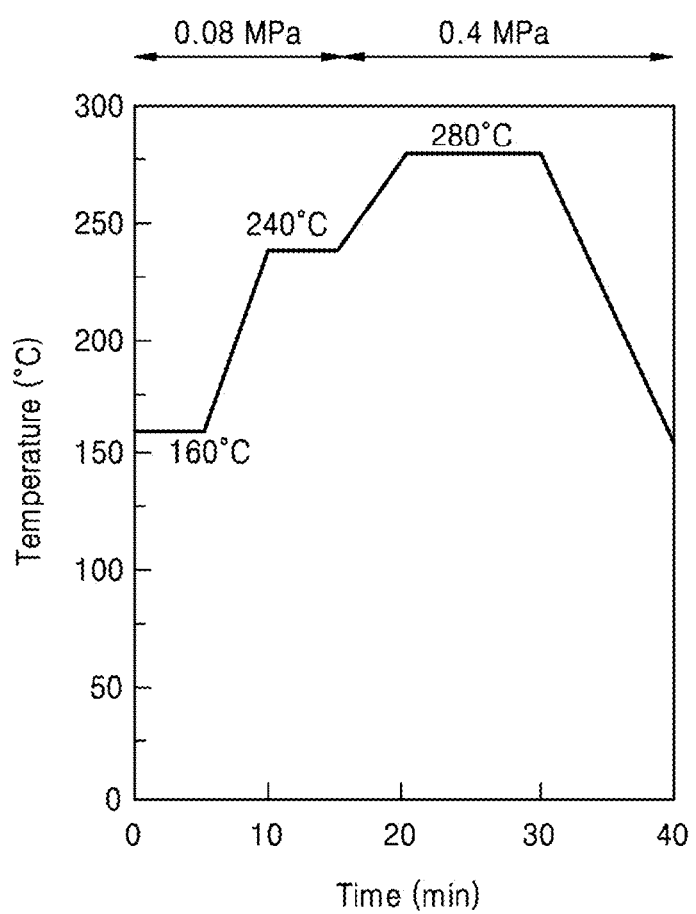
FIG. 11 is a graph showing conditions of a bonding process that may be used in a method of manufacturing a semiconductor device according to example embodiments.

Specific conditions (i.e., temperature/pressure) of a bonding process for forming the bonding structures B100 and B110 illustrated in FIGS. 8C and 9C from the structures of FIGS. 8B and 9B are shown in a graph of FIG. 11.

Referring to FIG. 11, a temperature of about 160° C. may be initially applied for about 5 minutes, and then the temperature may be raised up to about 240° C. for about 5 minutes. The temperature of 240° C. may be maintained for about 5 minutes. Then, the temperature may be raised up to about 280° C. for about 5 minutes, and then the temperature of about 280° C. may be maintained for about 10 minutes. Next, the temperature may be lowered up to about 160° C. for about 10 minutes. In the case of the pressure, a pressure of about 0.08 MPa may be initially applied for about 15 minutes, and then a pressure of about 0.4 MPa may be applied. The bonding structures B100 and B110 illustrated in FIGS. 8C and 9C may be formed through a bonding process having such conditions. However, the specific conditions shown in the graph of FIG. 11 are only examples and may be variously changed.

Figure 12:
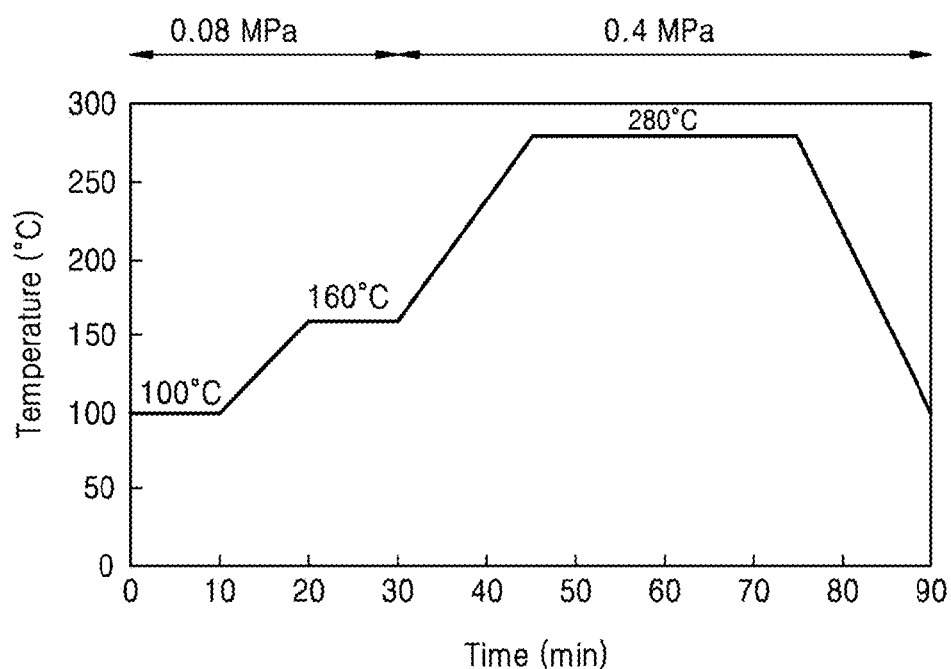
FIG. 12 is a graph showing conditions of a bonding process that may be used in a method of manufacturing a semiconductor device according to example embodiments.

Specific conditions (i.e., temperature/pressure) of a bonding process for forming the bonding structure B111 illustrated in FIG. 10 from the structures of FIGS. 8B and 9B are shown in a graph of FIG. 12.

Referring to FIG. 12, a temperature of about 100° C. may be initially applied for about 10 minutes, and then the temperature may be raised up to about 160° C. for about 10 minutes. The temperature of 160° C. may be maintained for about 10 minutes. Then, the temperature may be raised up to about 280° C. for about 15 minutes, and then the temperature of about 280° C. may be maintained for about 30 minutes. Next, the temperature may be lowered up to about 100° C. for about 15 minutes. In the case of the pressure, a pressure of about 0.08 MPa may be initially applied for about 30 minutes, and then a pressure of about 0.4 MPa may be applied. The bonding structure B111 illustrated in FIG. 10 may be formed through a bonding process having such conditions. By maintaining a relatively long heating time after slowly raising the temperature compared to the case of FIG. 11, the $Ni_3Sn$ area illustrated in FIG. 10 may be additionally formed. However, the specific conditions shown in the graph of FIG. 12 are only examples and may be variously changed.

As understood from the conditions shown in the graphs of FIGS. 11 and 12, the bonding process may be performed by using a temperature (low temperature) of about 300° C. or less and a pressure (low temperature) of about 0.5 MPa or less. In addition, the composition (contained material) of the bonding structure B111 may be controlled by adjusting conditions of the bonding process.

The first and second substrate structures 1000 and 2000 in FIGS. 8A through 8C, 9A through 9C, and 10 each may include a wafer-level substrate. That is, the first substrate structure 1000 may include a first wafer, and the second substrate structure 2000 may include a second wafer. At least one of the first and second substrate structures 1000 and 2000 may include a semiconductor device portion. The semiconductor device portion may have an array structure including a plurality of unit device portions.

When the first and second substrate structures 1000 and 2000 each includes a wafer-level substrate, a plurality of semiconductor chips may be formed from resultant structures of FIGS. 8C, 9C, and 10, and then a process of packaging the plurality of semiconductor chips may be performed. These processes are described in more detail with reference to FIGS. 13A through 13D and FIGS. 14A through 14C.

FIGS. 13A through 13D are cross-sectional views illustrating a method of manufacturing a semiconductor device according to example embodiments.

Figure 13A:
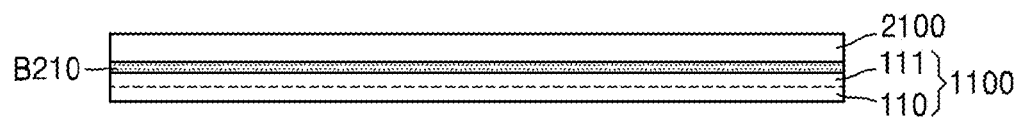
FIGS. 13A through 13D are cross-sectional views illustrating a method of manufacturing a semiconductor device according to example embodiments.

Referring to FIG. 13A, a stacked structure corresponding to a resultant structure of FIG. 8C, 9C, or 10 may be prepared. The stacked structure of FIG. 13A may include a first substrate structure 1100, a second substrate structure 2100, and a bonding structure B210 disposed between the first substrate structure 1100 and the second substrate structure 2100. The first substrate structure 1100 may include a first substrate 110 and a semiconductor device portion 111 disposed on the first substrate 110. The second substrate structure 2100 may include a second substrate. For example, the first substrate 110 may be a non-silicon based-substrate, and the second substrate may be a Si-based substrate. In example embodiments, the first substrate 110 may include any one selected from a GaN substrate, a SiC substrate, a GaAs substrate, and a sapphire substrate, and the second substrate may include a Si substrate. The bonding structure B210 may have a configuration that is the same as or similar to that of the bonding structure B100, B110, or B111 of FIG. 8C, 9C, or 10.

Figure 13B:
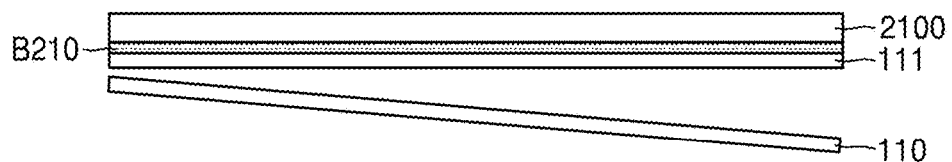

Referring to FIG. 13B, a portion of the first substrate structure 1100, for example, the first substrate 110, may be separated and removed from the semiconductor device portion 111. The first substrate 110 may be separated and removed by using one of various methods, e.g., a laser lift-off method. The semiconductor device portion 111 itself that remains after the first substrate 110 is removed may be regarded as a substrate structure (wafer structure) or a layer structure.

Figure 13C:
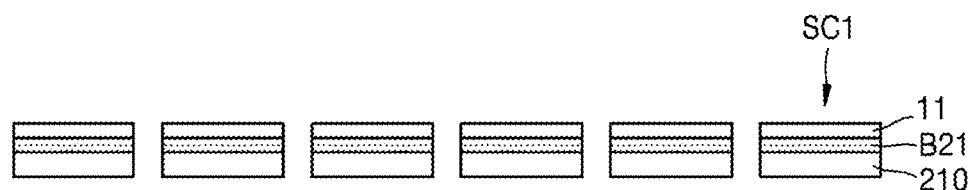

Referring to FIG. 13C, the stacked structure may be divided based on chip units to thereby form a plurality of semiconductor chips SC1, in a state in which the stacked structure including the second substrate structure 2100, the bonding structure B210, and the semiconductor device portion 111 is reversed. Each of the plurality of semiconductor chips SC1 may include a substrate portion 210 separated from the second substrate structure 2100, a bonding portion B21 separated from the bonding structure B210, and a unit device portion 11 separated from the semiconductor device portion 111. Each of the plurality of semiconductor chips SC1 may correspond to the semiconductor chip SC10 of FIG. 1.

Figure 13D:
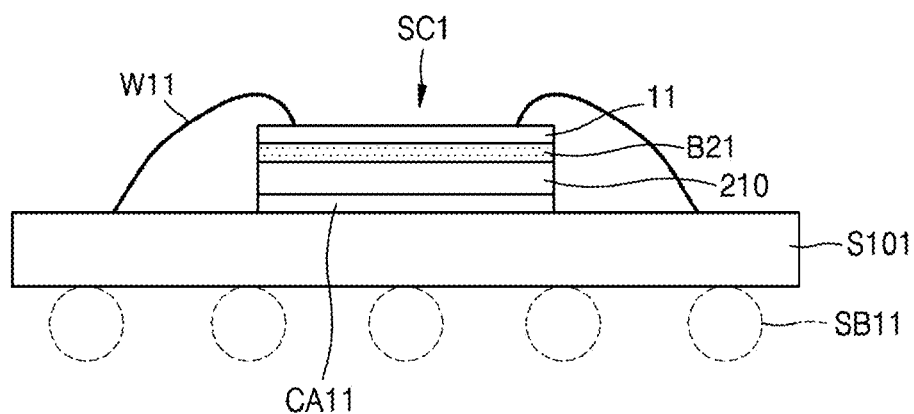

Referring to FIG. 13D, any one semiconductor chip SC1 selected from the plurality of semiconductor chips SC1 may be mounted on a base substrate S101. The semiconductor chip SC1 may be mounted on the base substrate S101 with a chip adhesive layer CA11 interposed therebetween. In addition, a plurality of bonding wires W11 may be disposed to electrically connect the semiconductor chip SC1 and the base substrate S101. According to necessity, a plurality of solder balls SB11 may be disposed on the lower surface of the base substrate S101. The structure of a semiconductor device of FIG. 13D may be similar to that of the semiconductor device of FIG. 1.

Figure 14A:
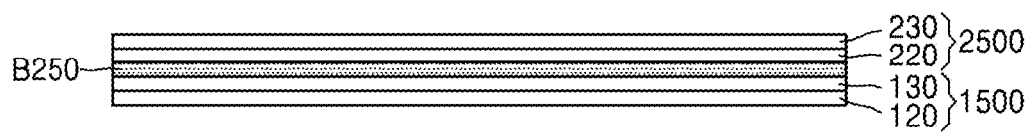
FIGS. 14A through 14C are cross-sectional views illustrating a method of manufacturing a semiconductor device according to example embodiments.
Figure 14B:
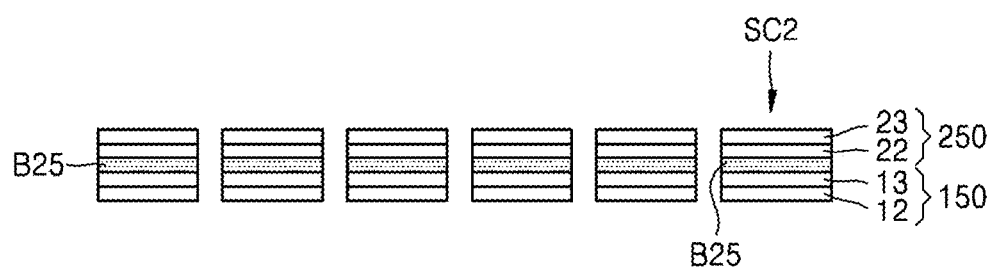
Figure 14C:
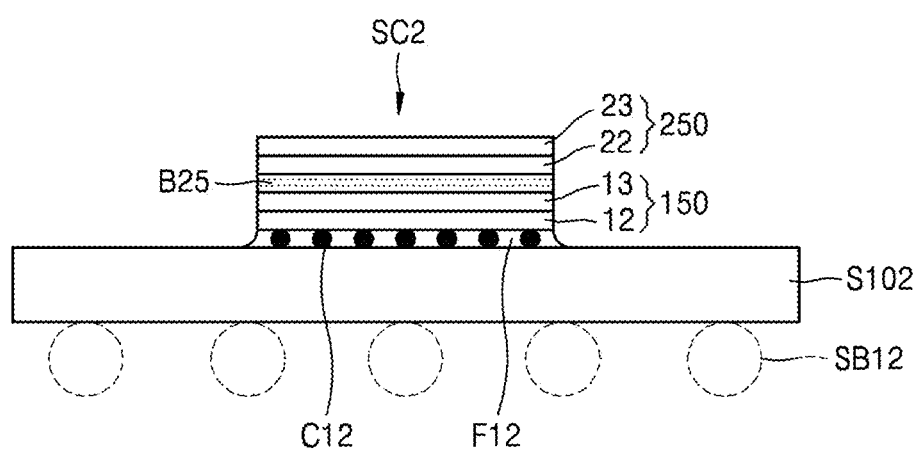

FIGS. 14A through 14C are cross-sectional views illustrating a method of manufacturing a semiconductor device according to example embodiments.

Referring to FIG. 14A, a stacked structure corresponding to a resultant structure of FIG. 8C, 9C, or 10 may be prepared. The stacked structure of FIG. 14A may include a first substrate structure 1500, a second substrate structure 2500, and a bonding structure B250 disposed between the first substrate structure 1500 and the second substrate structure 2500. The first substrate structure 1500 may include a first substrate 120 and a first semiconductor device portion 130 disposed on the first substrate 120. The second substrate structure 2500 may include a second substrate 220 and a second semiconductor device portion 230 disposed on the second substrate 220. The first and second substrates 120 and 220 may be different substrates, but may be identical substrates. The bonding structure B250 may have a configuration that is the same as or similar to that of the bonding structure B100, B110, or B111 of FIG. 8C, 9C, or 10.

Referring to FIG. 14B, the stacked structure including the first substrate structure 1500, the bonding structure B250, and the second substrate structure 2500 may be divided based on chip units to thereby form a plurality of semiconductor chips SC2. Each of the plurality of semiconductor chips SC2 may include a first substrate portion 150 separated from the first substrate structure 1500, a bonding portion B25 separated from the bonding structure B250, and a second substrate portion 250 separated from the second substrate structure 2500. The first substrate portion 150 may include a first unit substrate portion 12 separated from the first substrate 120 and a first unit device portion 13 separated from the first semiconductor device portion 130, and the second substrate portion 250 may include a second unit substrate portion 22 separated from the second substrate 220 and a second unit device portion 23 separated from the second semiconductor device portion 230. Each of the plurality of semiconductor chips SC2 may correspond to the semiconductor chip SC15 of FIG. 5.

Referring to FIG. 14C, any one semiconductor chip SC2 selected from the plurality of semiconductor chips SC2 may be mounted on a base substrate S102. A plurality of connection elements C12 may be disposed between the base substrate S102 and the semiconductor chip SC2. The plurality of connection elements C12 may be, for example, solder bumps. An underfill material F12 filling spaces between the plurality of connection elements C12 may be provided between the base substrate S102 and the semiconductor chip SC2. According to necessity, a plurality of solder balls SB12 may be disposed on the lower surface of the base substrate S102. The structure of a semiconductor device of FIG. 14C may be similar to that of the semiconductor device of FIG. 5.

Figure 15:
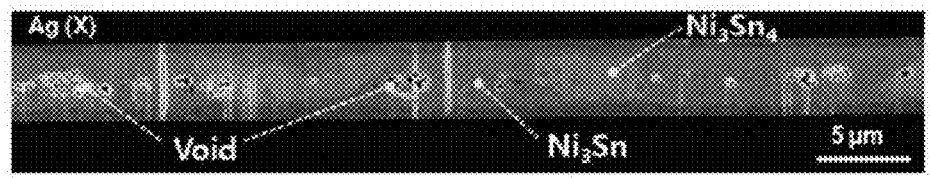
FIG. 15 is a focused ion beam scanning electron microscope (FIB-SEM) image showing a cross section of a bonding structure according to a comparison example.

FIG. 15 is a focused ion beam scanning electron microscope (FIB-SEM) image showing a cross section of a bonding structure according to a comparison example. FIG. 15 is a cross-sectional image of a bonding structure obtained by bonding the first and second metal layers ML11 and ML22 without using the Ag capping layers 30A and 30B in FIG. 9A.

Referring to FIG. 15, when an Ag capping layer is not used, a bonding portion of the bonding structure is mainly formed of $Ni_3Sn_4$ and $Ni_3Sn$ and voids having the size of about 1 μm exist in the bonding portion. Because a volume contraction of about 11% occurs in the process of forming an $Ni_3Sn_4$ intermetallic compound by a reaction between Ni and Sn, voids may be formed in an Ni—Sn solder bonding portion. In addition, because Ni has a relatively high elastic modulus that is about 200 GPa, the Ni—Sn solder bonding portion formed by an reaction between Ni and Sn may have brittleness, thereby lowering bonding reliability.

Figure 16:
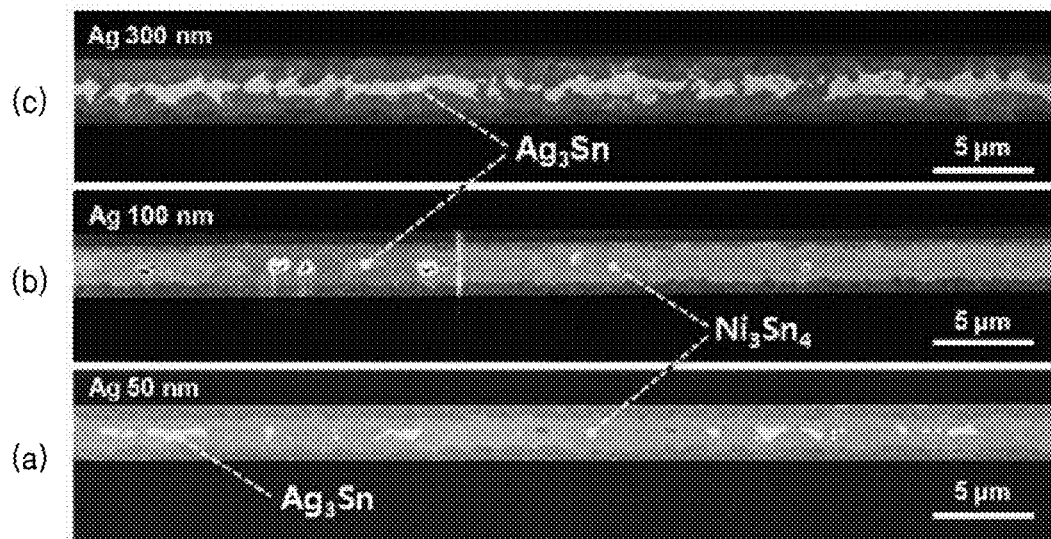
FIG. 16 is an FIB-SEM image showing a cross section of a bonding structure according to example embodiments.

FIG. 16 is an FIB-SEM image showing a cross section of a bonding structure according to example embodiments. FIG. 16 shows a cross section of a bonding structure formed with the method of FIGS. 9A through 9C. (a) of FIG. 16 shows a structure of the bonding structure B110 when the thickness of the Ag capping layer 30A or 30B are 50 nm, (b) of FIG. 16 shows a structure of the bonding structure B110 when the thickness of the Ag capping layers 30A or 30B are 100 nm, and (c) of FIG. 16 shows a structure of the bonding structure B110 when the thickness of the Ag capping layer 30A or 30B are 300 nm. The thickness of the first Ag capping layer 30A and the thickness of the second Ag capping layer 30B are equal to each other. Accordingly, the sum of the thickness of the first Ag capping layer 30A and the thickness of the second Ag capping layer 30B is 100 nm in the case of (a) of FIG. 16, is 200 nm in the case of (b) of FIG. 16, and is 600 nm in the case of (c) of FIG. 16.

Referring to FIG. 16, a bonding portion of a bonding structure may mainly include $Ag_3Sn$ and $Ni_3Sn_4$ when an Ag layer is used as a capping layer. An $Ag_3Sn$ content in the bonding portion and the form of $Ag_3Sn$ may vary according to the thickness of the Ag layer (capping layer). In the case that the thickness of the Ag layer is relatively thin, that is, in the cases of (a) and (b) of FIG. 16, $Ag_3Sn$ may exist in an island form. In the case that the thickness of the Ag layer is relatively thick, that is, in the case of (c) of FIG. 16, $Ag_3Sn$ may have a continuous layer structure or a structure that is similar thereto. Compared to an Ni—Sn solder bonding portion of FIG. 15 in which an Ag layer (capping layer) is not used, the number of voids greatly decrease or voids hardly occur. A void region, which occurs due to a volume contraction of a bonding portion which occurs during a reaction between Ni and Sn, may be filled with $Ag_3Sn$ that is formed by a reaction between Ag and Sn. In addition, an average elastic modulus of a bonding portion may be reduced to an appropriate level, and thus, the strength and reliability of the bonding portion may be improved. Because Ag is ductile compared to Ni, an $Ag_3Sn$ intermetallic compound may lower an average elastic modulus of an Ni—Sn solder bonding portion. As a result, a brittleness problem may be solved, and bonding strength and reliability may be improved.

Figure 17:
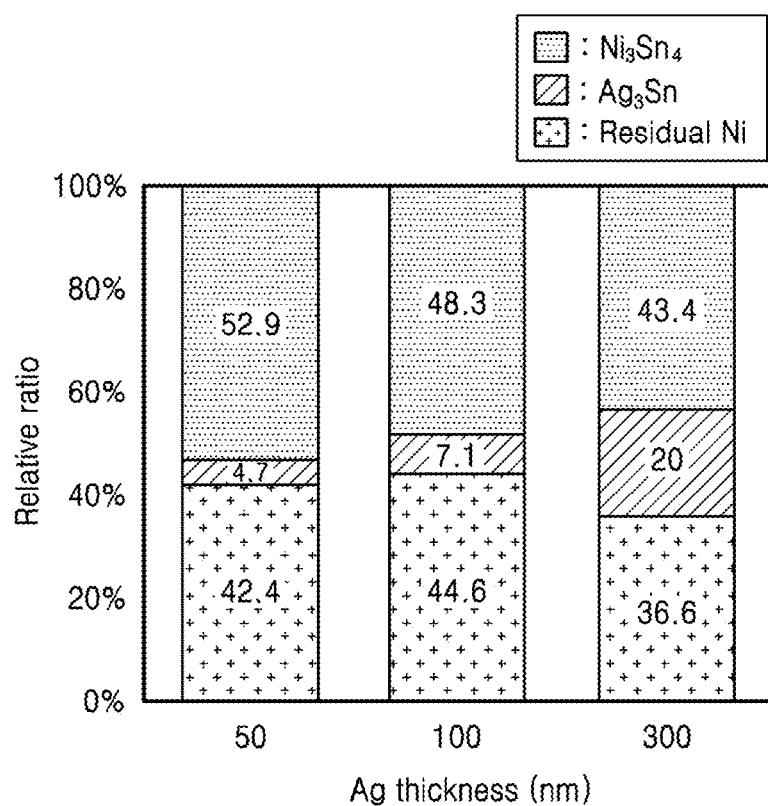
FIG. 17 is a graph showing a relative ratio of composition elements of a bonding structure according to the thickness of a silver (Ag) capping layer, in a method of manufacturing a bonding structure according to example embodiments.

FIG. 17, which is obtained from a result of FIG. 16, is a graph showing relative ratios of composition elements ($Ag_3Sn$, $Ni_3Sn_4$, and residual Ni) in a bonding structure according to the thickness of an Ag layer (capping layer). The relative ratios denote relative ratios of areas occupied by the composition elements ($Ag_3Sn$, $Ni_3Sn_4$, and residual Ni) in a cross section of the bonding structure. In FIG. 17, 50 nm, 100 nm, and 300 nm, which indicate a thickness of an Ag layer, correspond to 50 nm, 100 nm, and 300 nm of FIG. 16. That is, the thickness of the Ag layer is a thickness of any one of the first and second Ag capping layers 30A and 30B, and the thickness of the first Ag capping layer 30A and the thickness of the second Ag capping layer 30B are equal to each other. Accordingly, the sum of the thickness of the first Ag capping layer 30A and the thickness of the second Ag capping layer 30B is 100 nm, 200 nm, or 600 nm.

Referring to FIG. 17, a relative ratio of $Ag_3Sn$ occupied in the bonding structure increases according to an increase in the thickness of the Ag layer (capping layer). When the thickness of the Ag layer (capping layer) is 300 nm, a relative ratio of $Ag_3Sn$ in the bonding structure may increase up to about 20%. In example embodiments, $Ag_3Sn$ may have a continuous layer structure or a structure that is similar thereto, as shown in FIG. 16.

Figure 18:
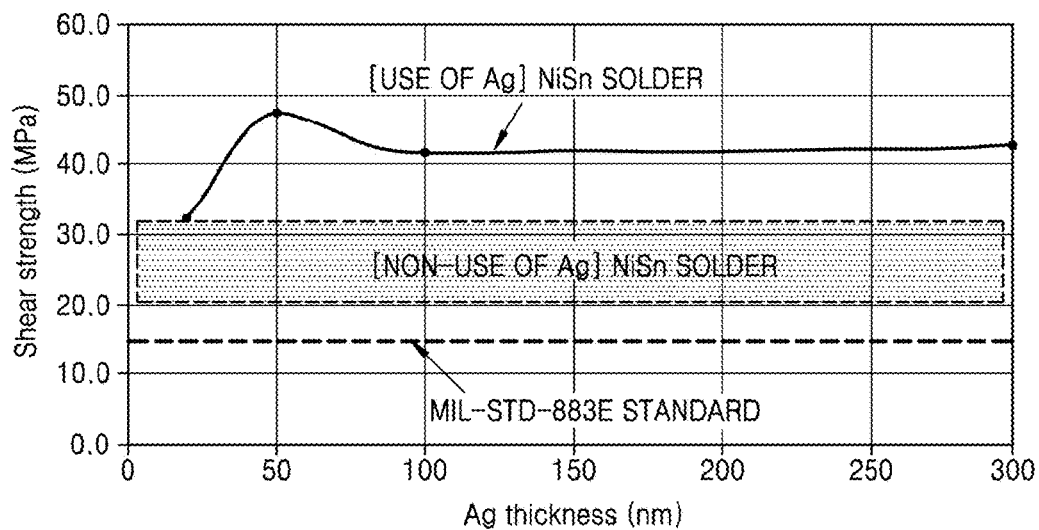
FIG. 18 is a graph showing a change in a mechanical bonding strength (i.e., a die shear strength) of a bonding structure according to the thickness of an Ag capping layer used in manufacturing a bonding structure according to example embodiments.

FIG. 18 is a graph showing a change in a die shear strength that is a mechanical bonding strength of a bonding structure according to the thickness of an Ag capping layer used in manufacturing a bonding structure according to example embodiments. FIG. 18 shows results for a bonding structure formed by using the method (method using an asymmetrical structure) of FIGS. 8A through 8C. FIG. 18 includes a result of a case in which Ag is not used, and includes a military-standard-883E (MIL-STD-883E) strength. In FIG. 18, the case in which Ag is not used corresponds to a case in which an Au capping layer instead of an Ag capping layer is used. That is, in FIG. 18, the case in which Ag is not used corresponds to a case in which an Au layer instead of an Ag layer is used as the first and second capping layers 30A and 30B in FIGS. 8A through 8C.

Referring to FIG. 18, when Ag is not used in an asymmetrical structure, the die shear strength, that is, the mechanical bonding strength of a bonding structure, is about 20 MPa to about 32 MPa. On the other hand, when Ag is used in the asymmetrical structure, the mechanical bonding strength of the bonding structure increases. When Ag is used, the bonding strength increases up to maximum about 48.8%.

Figure 19:
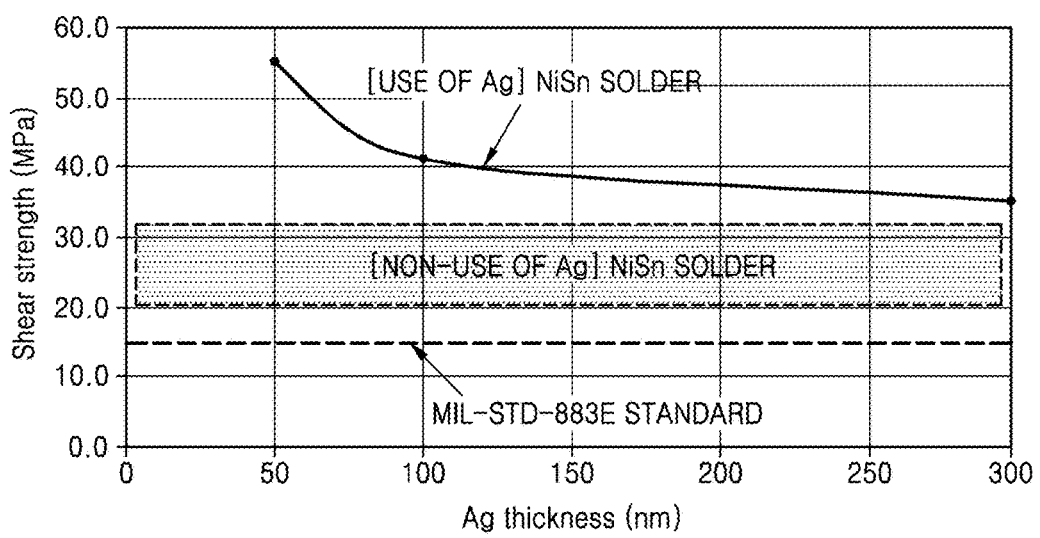
FIG. 19 is a graph showing a change in a mechanical bonding strength of a bonding structure according to the thickness of an Ag capping layer used in manufacturing a bonding structure according to example embodiments.

FIG. 19 is a graph showing a change in a die shear strength that is a mechanical bonding strength of a bonding structure according to the thickness of an Ag capping layer used in manufacturing a bonding structure according to example embodiments. In FIG. 19, a result of a case in which Ag is used shows a result for a bonding structure formed by using the method (method using a symmetrical structure) of FIGS. 9A through 9C. Similar to FIG. 18, FIG. 19 includes a result of a case in which Ag is not used and a military-standard-883E (MIL-STD-883E) strength. The case in which Ag is not used corresponds to a case in which an Au layer instead of an Ag layer is used in a method using an asymmetrical structure.

Referring to FIG. 19, when Ag is not used, the die shear strength, that is, the mechanical bonding strength of a bonding structure, is about 20 MPa to about 32 MPa in the same manner as in FIG. 18. When Ag is used in a symmetrical structure, the mechanical bonding strength of the bonding structure increases up to maximum about 72%.

Results of FIGS. 18 and 19, in a case in which an Ag capping layer is used, a bonding strength of a bonding structure may be improved compared to a case in which an Ag capping layer is not used (i.e., a case in which an Au capping layer instead of an Ag capping layer is used). In addition, because a bonding structure according to example embodiments does not include high-priced Au, the bonding structure may have a more competitive cost.

Figure 20:
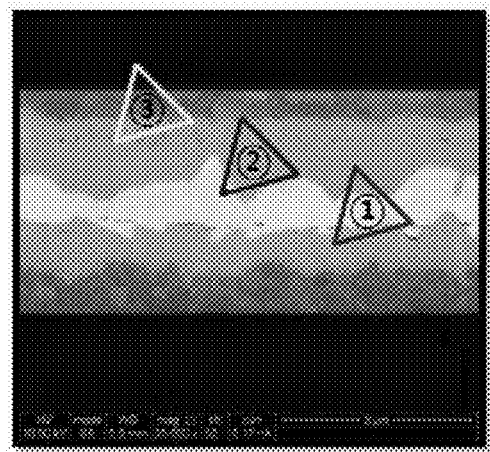
FIG. 20 is an FIB-SEM image showing a cross section of a bonding structure according to example embodiments, where three measurement positions for a physical property evaluation are indicated.

FIG. 20 is an FIB-SEM image showing three measurement positions (i.e., positions ①, ②, and ③) for an evaluation of physical properties of a bonding structure manufactured by applying an Ag capping layer to a symmetrical structure (the structure of FIG. 9A). In example embodiments, the thickness of a used Ag capping layer is 300 nm, and the sum of the thicknesses of two Ag capping layers is 600 nm.

In FIG. 20, a region of the position ① is mainly formed of Ag₃Sn intermetallic compound and may include a small amount of Ni₃Sn₄ intermetallic compound. A region of the position ② is mainly formed of Ni₃Sn₄ intermetallic compound and may partially include Ag₃Sn intermetallic compound and Ni. A region of the position ③ is mainly formed of Ni and may include a small amount of Ni₃Sn₄ intermetallic compound.

Figure 21:
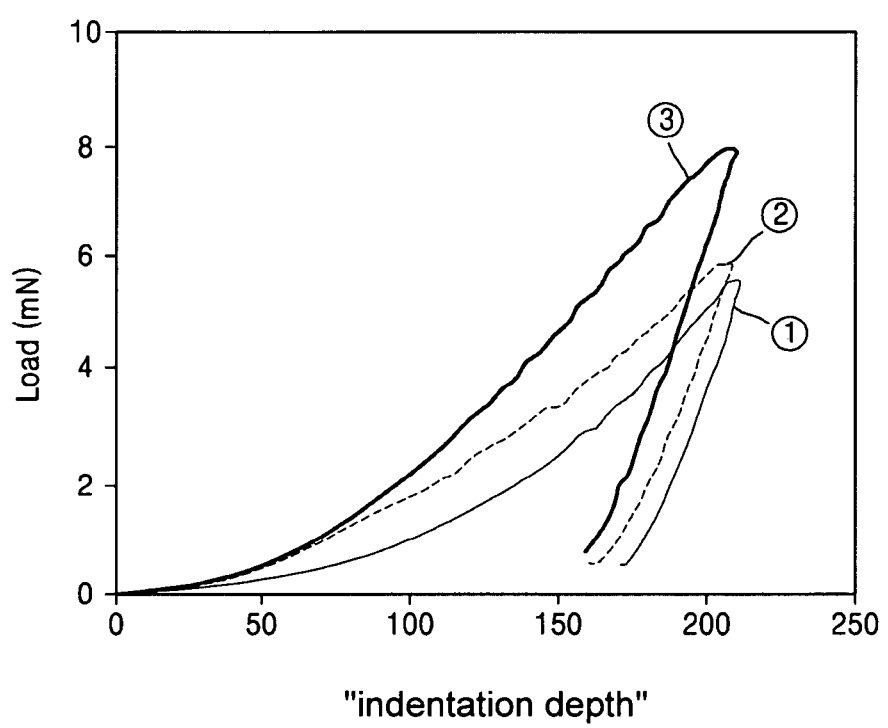
FIGS. 21 through 23 are graphs showing physical property evaluation results for the three measurement positions indicated in FIG. 20.
Figure 22:
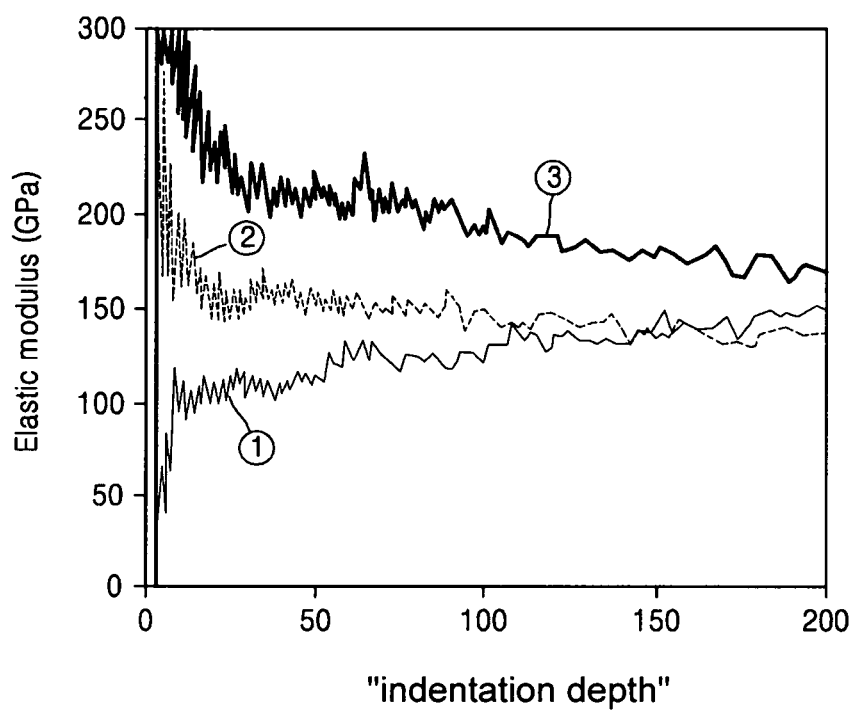
Figure 23:
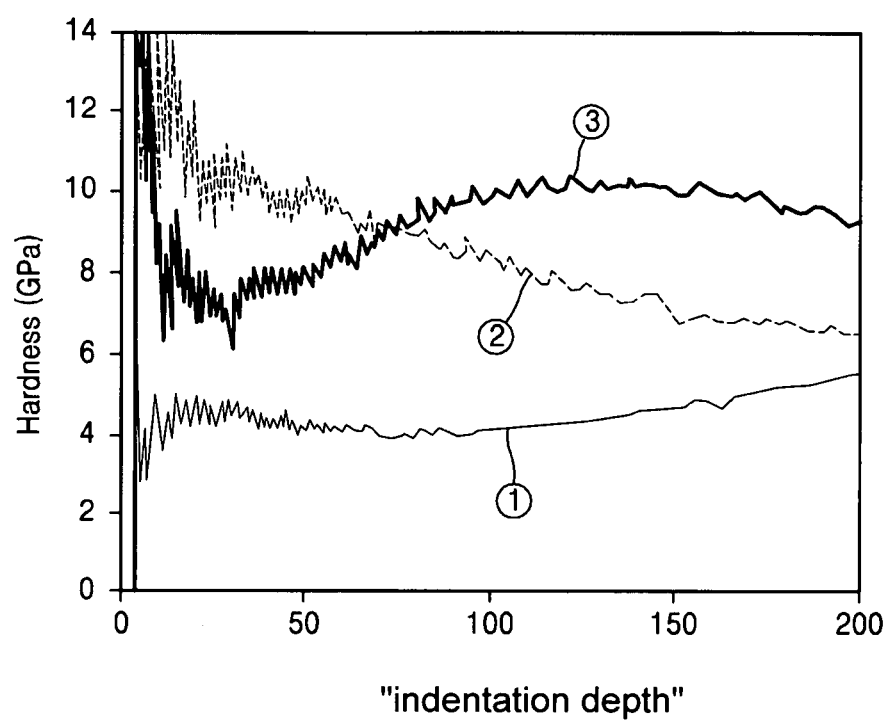

FIGS. 21 through 23 are graphs showing physical property evaluation results for the positions ①, ②, and ③ shown in FIG. 20. FIG. 21 shows a change in load with respect to displacement, FIG. 22 shows a change in elastic modulus with respect to displacement, and FIG. 23 shows a change in hardness with respect to displacement. The displacement denotes a position change in a direction toward a depth at the positions ①, ②, and ③. Results of FIGS. 22 and 23 are calculated from results of FIG. 21.

Table 1 includes elastic modulus values and hardness values for the positions ①, ②, and ③, which are calculated from results of FIGS. 22 and 23. The elastic modulus values and the hardness values are average values obtained in a saturated or stable section of each of the graphs of FIGS. 22 and 23.

TABLE 1

| | Position | | |
|---|---|---|---|
| | ① | ② | ③ |
| Elastic Modulus (GPa) | 123.5 | 151.6 | 207.2 |
| Hardness (GPa) | 4.05 | 8.91 | 9.21 |

Referring to FIG. 22, the elastic modulus of the position ① is relatively low. According to literatures, the elastic modulus of Ni is about 200 GPa, the elastic modulus of Ag is about 83 GPa, and the elastic modulus of ①, ②, and ③ is about 152 GPa. When Ag is applied to an Ni—Sn solder, an Ag₃Sn intermetallic compound having relatively ductile characteristics may be formed and an average elastic modulus value of the entire Ni—Sn solder bonding portion may be lowered. The brittleness of a bonding portion may be reduced and the strength and reliability thereof may be improved. When an average elastic modulus of a bonding portion has an appropriate value that is not excessively low or high, the bonding portion (bonding structure) may have improved strength and reliability. As shown in Table 1, an average elastic modulus of the entire intermetallic compound of the bonding structure may have about 123 GPa to about 152 GPa or about 124 GPa to about 152 GPa, and such a bonding structure may have improved strength and reliability.

Referring to FIG. 23, the hardness of the position ① is relatively low. This means that an average hardness of the entire Ni—Sn solder bonding portion is lowered due to an Ag₃Sn intermetallic compound of the position ①. Due to the Ag₃Sn intermetallic compound, the Ni—Sn solder bonding portion may have an appropriate level of hardness. The brittleness of a bonding portion may be reduced and the strength and reliability thereof may be improved. As shown in Table 1, an average hardness of the entire intermetallic compound of the bonding structure may have about 4 GPa to about 9 GPa or about 4.5 GPa to about 9 GPa, and such a bonding structure may have improved strength and reliability.

The bonding method (wafer bonding method) described above and a bonding structure manufactured by the bonding method may be applied to various semiconductor devices (semiconductor packages). In particular, the bonding method and the bonding structure may be applied to an LED using a semiconductor material, e.g., a Group III-V semiconductor (nitride semiconductor). When manufacturing a vertical LED, the bonding method (wafer bonding method) may be usefully used. For example, after growing a semiconductor layer on a growth substrate (e.g., a sapphire substrate, a GaN substrate, or a SiC substrate), another substrate may be attached onto the semiconductor layer, and then, the growth substrate may be removed and remaining subsequent processes may be performed. In example embodiments, a process of attaching another substrate onto the semiconductor layer may be performed with a wafer scale.

Next, a dicing process of dividing the substrate (wafer) into unit devices may be performed. The semiconductor chip SC1 shown in FIG. 13C may be obtained through such processes. However, the bonding method and the bonding structure may be widely applied to various semiconductor devices and electronic devices in addition to LEDs. For example, the bonding method and the bonding structure may be applied to various fields, for example, MEMS, optoelectronic devices, surface-emitting optical devices, display devices, light sources of display devices, automotive electronics, optical communication devices, and power devices, in addition to a general semiconductor chip field.

While example embodiments have been described above, they should be construed not as limiting the scope of the inventive concepts but as merely examples. For example, it will be understood by those of ordinary skill in the art that various changes in the configurations of the semiconductor chips and semiconductor devices (packages) illustrated in FIGS. 1 through 7 may be made. The methods of manufacturing the semiconductor chips/semiconductor devices (packages) described with reference to FIGS. 8A through 8C, 9A through 9C, 10 through 12, 13A through 13D, and 14A through 14C may also be modified in various ways. The bonding structure described above and a method (substrate bonding method) of manufacturing the bonding structure may be applied to various semiconductor devices and electronic devices. Therefore, the scope of the inventive concepts is defined not by the detailed description but by the technical spirit set forth in the appended claims.

It should be understood that example embodiments described herein should be considered in a descriptive sense only and not for purposes of limitation. Descriptions of features or aspects within each embodiment should typically be considered as available for other similar features or aspects in other embodiments.

What is claimed is:
1. A semiconductor device comprising:
a base substrate; and
a semiconductor chip on the base substrate, the semiconductor chip being an individual semiconductor chip, the semiconductor chip including:
  a first layer structure and a second layer structure opposite to the first layer structure, the second layer structures is a semiconductor device portion, and
  a bonding structure between the first layer structure and the second layer structure, the bonding structure including a silver-tin (Ag—Sn) compound portion and a nickel-tin (Ni—Sn) compound portion above and below the Ag—Sn compound portion, the Ag—Sn compound portion and the Ni—Sn compound portion having a same width in a horizontal direction such that edge portions of the Ag—Sn compound portion are exposed and edge portions of the Ni—Sn compound portion are exposed, wherein the first layer structure is a chip substrate including a semiconductor substrate, wherein the chip substrate including the semiconductor substrate is between the base substrate and the semiconductor device portion, and wherein the individual semiconductor chip includes the chip substrate, the semiconductor device portion and the bonding structure between the chip substrate and the semiconductor device portion.

2. The semiconductor device of claim 1, wherein the bonding structure further includes pure Ni.

3. The semiconductor device of claim 1, wherein
the Ag—Sn compound portion includes $Ag_3Sn$, and
the Ni—Sn compound portion includes $Ni_3Sn_4$.

4. The semiconductor device of claim 3, wherein the bonding structure includes
an intermediate layer including the $Ag_3Sn$ portion and the $Ni_3Sn_4$ portion,
a first Ni layer between the intermediate layer and the first layer structure, and
a second Ni layer between the intermediate layer and the second layer structure.

5. The semiconductor device of claim 3, wherein the Ni—Sn compound portion further includes $Ni_3Sn$.

6. The semiconductor device of claim 1, wherein an Ag content in the bonding structure is about 0.5 wt % to about 23.1 wt %.

7. The semiconductor device of claim 1, wherein the semiconductor device portion includes a light-emitting device portion.

8. The semiconductor device of claim 7, wherein
the first layer structure includes a silicon (Si) substrate,
the second layer structure includes the light-emitting device portion, and
the light-emitting device portion includes a Group III-V semiconductor.

9. The semiconductor device of claim 1, wherein
the first layer structure includes a first substrate and a first semiconductor device portion on the first substrate, and
the second layer structure includes a second substrate and a second semiconductor device portion on the second substrate.

10. The semiconductor device of claim 1, wherein at least one third layer structure is bonded onto the second layer structure.

11. The semiconductor device of claim 1, wherein a die shear strength of the bonding structure is 32 MPa or more.

12. The semiconductor device of claim 1, wherein a re-melting temperature of the bonding structure is 350 deg. C. or more.

13. The semiconductor device of claim 1, wherein an average elastic modulus of both the Ag—Sn compound portion and the Ni—Sn compound portion is 124 GPa to 152 GPa.

14. The semiconductor device of claim 1, wherein an average hardness of both the Ag—Sn compound portion and the Ni—Sn compound portion is 4.5 GPa to 9 GPa as measured by a Vickers hardness scale.

15. A semiconductor chip, the semiconductor chip comprising:
a bonding layer between a first layer structure and a second layer structure, the bonding layer including a silver-tin (Ag—Sn) compound portion and a nickel-tin (Ni—Sn) compound portion above and below the Ag—Sn compound portion, the Ag—Sn compound portion and the Ni—Sn compound portion having a same width in a horizontal direction such that edge portions of the Ag—Sn compound portion are exposed and edge portions of the Ni—Sn compound portion are exposed, wherein the semiconductor chip is an individual semiconductor chip, wherein the first layer structure is a chip substrate including a semiconductor substrate, and the second layer structure is a semiconductor device portion, and wherein the individual semiconductor chip includes the chip substrate, the semiconductor device portion and the bonding layer between the chip substrate and the semiconductor device portion.

16. The semiconductor chip of claim 15, wherein
the Ag—Sn compound portion includes $Ag_3Sn$, and
the Ni—Sn compound portion includes $Ni_3Sn_4$.

17. The semiconductor chip of claim 16, wherein the Ni—Sn compound portion further includes $Ni_3Sn$.

18. The semiconductor chip of claim 16, wherein the bonding layer includes
an intermediate layer including the $Ag_3Sn$ portion and the $Ni_3Sn_4$ portion,
a first layer on a first side of the intermediate layer, the first layer including pure Ni, and
a second layer on a second side of the intermediate layer, the second layer including pure Ni.

19. The semiconductor chip of claim 15, wherein an Ag content in the bonding layer is about 0.5 wt % to about 23.1 wt %.

20. The semiconductor chip of claim 15, wherein
the first layer structure includes a first substrate and a first semiconductor device portion on the first substrate, and
the second layer structure includes a second substrate and a second semiconductor device portion on the second substrate.

21. A semiconductor device comprising:
a base substrate;
a semiconductor chip on the base substrate, the semiconductor chip being an individual semiconductor chip, the semiconductor chip including:
a first layer structure and a second layer structure opposite to the first layer structure, at least one of the first and second layer structures including a semiconductor device portion, and
a bonding structure between the first layer structure and the second layer structure, the bonding structure including a silver-tin (Ag—Sn) compound portion and a nickel-tin (Ni—Sn) compound portion above and below the Ag—Sn compound portion; and
a filling material between the base substrate and the semiconductor chip,
wherein the bonding structure is spaced apart from the filling material and no portion of the bonding structure contacts the filling material;
wherein the first layer structure is a chip substrate including a semiconductor substrate, and the second layer structure is the semiconductor device portion,
wherein the chip substrate including the semiconductor substrate is between the filling material and the semiconductor device portion, and
wherein the individual semiconductor chip includes the chip substrate, the semiconductor device portion and the bonding structure between the chip substrate and the semiconductor device portion.

* * * * *